United States Patent
Harame et al.

(10) Patent No.: US 8,673,726 B2
(45) Date of Patent: Mar. 18, 2014

(54) TRANSISTOR STRUCTURE WITH A SIDEWALL-DEFINED INTRINSIC BASE TO EXTRINSIC BASE LINK-UP REGION AND METHOD OF FORMING THE TRANSISTOR

(71) Applicant: International Business Machines Corporation, Armonk, NY (US)

(72) Inventors: David L. Harame, Essex Junction, VT (US); Russell T. Herrin, Essex Junction, VT (US); Qizhi Liu, Waltham, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/762,445

(22) Filed: Feb. 8, 2013

(65) Prior Publication Data
US 2013/0149832 A1    Jun. 13, 2013

Related U.S. Application Data

(60) Division of application No. 12/967,268, filed on Dec. 14, 2010, now Pat. No. 8,513,084, and a continuation-in-part of application No. 12/817,249, filed on Jun. 17, 2010, now Pat. No. 8,405,186.

(51) Int. Cl.
    *H01L 21/00*    (2006.01)
(52) U.S. Cl.
    USPC .......................................... 438/353; 438/312
(58) Field of Classification Search
    USPC ................................................ 438/353–363
    See application file for complete search history.

(56) References Cited

U.S. PATENT DOCUMENTS

| | | | |
|---|---|---|---|
| 4,170,492 | A | 10/1979 | Bartlett et al. |
| 4,470,852 | A | 9/1984 | Ellsworth |
| 5,834,800 | A | 11/1998 | Jalali-Farahani et al. |
| 5,869,385 | A | 2/1999 | Tang et al. |
| 5,963,817 | A | 10/1999 | Chu et al. |
| 6,610,143 | B2 | 8/2003 | Zdebel et al. |
| 6,960,820 | B2 | 11/2005 | Freeman et al. |
| 6,972,443 | B2 | 12/2005 | Khater |
| 7,037,798 | B2 | 5/2006 | Adam et al. |
| 7,087,940 | B2 | 8/2006 | Khater et al. |

(Continued)

OTHER PUBLICATIONS

Camillo-Castillo et al., U.S. Appl. No. 12/817,249, filed Jun. 17, 2010.

(Continued)

*Primary Examiner* — Richard Booth
(74) *Attorney, Agent, or Firm* — Gibb & Riley, LLC; Anthony J. Canale

(57) ABSTRACT

Disclosed are embodiments of a bipolar or heterojunction bipolar transistor and a method of forming the transistor. The transistor can incorporate a dielectric layer sandwiched between an intrinsic base layer and a raised extrinsic base layer to reduce collector-base capacitance $C_{cb}$, a sidewall-defined conductive strap for an intrinsic base layer to extrinsic base layer link-up region to reduce base resistance $R_b$ and a dielectric spacer between the extrinsic base layer and an emitter layer to reduce base-emitter $C_{be}$ capacitance. The method allows for self-aligning of the emitter to base regions and incorporates the use of a sacrificial dielectric layer, which must be thick enough to withstand etch and cleaning processes and still remain intact to function as an etch stop layer when the conductive strap is subsequently formed. A chemically enhanced high pressure, low temperature oxidation (HIPOX) process can be used to form such a sacrificial dielectric layer.

20 Claims, 15 Drawing Sheets

(56) References Cited

U.S. PATENT DOCUMENTS

| | | | |
|---|---|---|---|
| 7,119,416 | B1 | 10/2006 | Adam et al. |
| 7,709,338 | B2 | 5/2010 | Liu et al. |
| 8,513,084 | B2 * | 8/2013 | Harame et al. ............... 438/362 |
| 2001/0053584 | A1 | 12/2001 | Chantre et al. |
| 2005/0012180 | A1 | 1/2005 | Freeman et al. |
| 2008/0265282 | A1 | 10/2008 | Gluschenkov et al. |

OTHER PUBLICATIONS

Chevalier et al., "Si/Ge HBT's for Millimeter-Wave BiCMOS Technologies", Device Research Conference, 2008, IEEE, Piscataway NJ, Jun. 23, 2008, pp. 195-198.

International Search Report, PCT/US2011/036729, Jul. 28, 2011.
U.S. Appl. No. 12/817,249, filed Jun. 17, 2010, Office Action Communication dated Jun. 21, 2012, 10 pages.
U.S. Appl. No. 12/817,249, filed Jun. 17, 2010, Office Action Communication dated Mar. 29, 2012, 6 pages.
U.S. Appl. No. 12/817,249, filed Jun. 17, 2010, Notice of Allowance Communication dated Nov. 20, 2012, 10 pages.
U.S. Appl. No. 12/967,268, filed Dec. 14, 2010, Office Action Communication dated Nov. 19, 2012, 6 pages.
U.S. Appl. No. 12/967,268, filed Dec. 14, 2010, Office Action Communication dated Dec. 7, 2012, 11 pages.
U.S. Appl. No. 12/967,268, filed Dec. 14, 2010, Notice of Allowance Communication dated Apr. 12, 2013, 16 pages.

\* cited by examiner

TRANSISTOR STRUCTURE WITH A SIDEWALL-DEFINED INTRINSIC BASE TO EXTRINSIC BASE LINK-UP REGION AND METHOD OF FORMING THE TRANSISTOR

CROSS REFERENCE TO RELATED APPLICATIONS

This application is a divisional of U.S. application Ser. No. 12/967,268, filed Dec. 14, 2010, issued as U.S. Pat. No. 8,513,084 on Aug. 20, 2013, which is a continuation-in-part of U.S. application Ser. No. 12/817,249, filed Jun. 17, 2010, issued as U.S. Pat. No. 8,405,186 on Mar. 26, 2013, the complete disclosures of which are incorporated herein by reference.

BACKGROUND

1. Field of the Invention

The embodiments of the present invention relate generally to transistors and, more particularly, to a transistor structure, such as a bipolar transistor (BT) structure or heterojunction bipolar transistor (HBT) structure, with a sidewall-defined conductive strap for an intrinsic base to extrinsic base link-up region, and a method of forming the transistor.

2. Description of the Related Art

As discussed in U.S. Pat. No. 6,972,443 issued on Dec. 6, 2005 to Khater, assigned to International Business Machines Corporation and incorporated herein by reference, it is desirable in bipolar transistors (BTs) and, particularly, in high performance heterojunction bipolar transistors (HBTs) to have a relatively high transit frequency $f_T$ and maximum oscillation frequency $F_{max}$. $F_{max}$ is a function of $f_T$ and of parasitics, including parasitic capacitances and parasitic resistances. Exemplary parasitics include, but are not limited to, collector-base capacitance $C_{cb}$, base-emitter $C_{be}$ capacitance and base resistance $R_b$. Thus, it would be advantageous to provide transistors structure, such as a BT structure or HBT structure, with reduced collector-base capacitance $C_{cb}$ and reduced base resistance $R_b$, as well as a method for forming such a structure.

SUMMARY

Previously disclosed embodiments of the present invention included a transistor structure (e.g., a bipolar transistor (BT) structure or heterojunction bipolar transistor (HBT) structure) with a sidewall-defined conductive strap for an intrinsic base to extrinsic base link-up region and a method of forming such a transistor structure.

Specifically, one embodiment of a transistor structure (e.g., a BT structure or HBT structure) according to the present invention can comprise a semiconductor substrate. An intrinsic base layer can be positioned on the top surface of the semiconductor substrate. A dielectric layer can be positioned on the intrinsic base layer and an extrinsic base layer can be positioned on the dielectric layer. Additionally, a trench can extend through the extrinsic base layer and the dielectric layer to the intrinsic base layer. This trench can have a sidewall. A conductive strap can be positioned within the trench on the intrinsic base layer and adjacent to the sidewall such that it electrically connects the intrinsic base layer to the extrinsic base layer.

Another embodiment of a transistor structure (e.g., a BT structure or HBT structure) according to the present invention can comprise a semiconductor substrate. Trench isolation regions can be positioned within and at the top surface of the semiconductor substrate. An intrinsic base layer can be positioned on the top surface of the semiconductor substrate and can extend laterally over the trench isolation regions. Specifically, the intrinsic base layer can comprise an epitaxial semiconductor layer. For example, in the case of a BT transistor, the intrinsic base layer can comprise an epitaxial silicon layer. This epitaxial silicon layer can comprise a first section comprising single crystalline silicon above the top surface of the substrate and a second section comprising polycrystalline silicon above the trench isolation regions. Alternatively, in the case of a HBT structure, the intrinsic base layer can comprise an epitaxial silicon germanium layer. This epitaxial silicon germanium layer can comprise a first section comprising single crystalline silicon germanium above the top surface of the substrate and a second section comprising polycrystalline silicon germanium on the trench isolation regions. A dielectric layer can be positioned on the intrinsic base layer and can extend laterally over both the first section and the second section of the intrinsic base layer. An extrinsic base layer can be positioned on the dielectric layer. Additionally, a trench can extend through the extrinsic base layer and the dielectric layer to the first section (i.e., the single crystalline section) of intrinsic base layer. This trench can have a vertical sidewall. An essentially rectangular shaped conductive strap can be positioned within trench on the intrinsic base layer and adjacent to the vertical sidewall such that it electrically connects the intrinsic base layer to the extrinsic base layer.

One embodiment of a method of forming a transistor structure (e.g., a BT structure or HBT structure) according to the present invention can comprise providing a semiconductor substrate. An intrinsic base layer can be formed on the top surface of the semiconductor substrate. A dielectric layer can be formed on the intrinsic base layer and an extrinsic base layer can be formed on the dielectric layer. A trench, having a sidewall, can be formed extending through the extrinsic base layer and the dielectric layer to the intrinsic base layer. Then, a conductive strap can be formed within the trench on the intrinsic base layer and adjacent to the sidewall such that it electrically connects the intrinsic base layer to the extrinsic base layer.

Another embodiment of a method of forming a transistor (e.g., a BT structure or HBT structure) according to the present invention can comprise providing a semiconductor substrate. Trench isolation regions can be formed within and at the top surface of the semiconductor substrate.

An intrinsic base layer can be formed on the top surface of the semiconductor substrate and extending laterally over the trench isolation regions. In order to form this intrinsic base layer an epitaxial semiconductor layer can be formed. For example, in the case of a BT structure, an epitaxial silicon layer can be formed with a first section, above the top surface of the substrate, comprising single crystalline silicon and with a second section, above the trench isolation regions, comprising polycrystalline silicon. Alternatively, in the case of a HBT structure, an epitaxial silicon germanium layer can be formed with a first section, above the top surface of the substrate, comprising single crystalline silicon germanium and a second section, above the trench isolation regions, comprising polycrystalline silicon germanium.

Next, a first dielectric layer (e.g., a first oxide layer) can be formed on the intrinsic base layer and an extrinsic base layer (e.g., a doped polysilicon layer) can be formed on the first dielectric layer. After the extrinsic base layer is formed, at least one second dielectric layer can be formed on the extrinsic base layer. For example, a stack of dielectric layers can be formed on the extrinsic base layer. This stack can comprise a second oxide layer on the extrinsic base layer, a nitride layer on the second oxide layer and a third oxide layer on the nitride layer).

Then, an opening can be formed extending vertically through the stack of dielectric layers to the extrinsic base layer. After the opening is formed, a sacrificial sidewall spacer (e.g., a sacrificial nitride spacer) can be formed on a first vertical sidewall of the opening. Then, a sacrificial dielectric layer can be formed on an exposed surface of the extrinsic base layer within the opening adjacent to the sacrificial sidewall spacer. For example, an oxidation process can be performed in order to form a sacrificial oxide layer on the exposed surface of the extrinsic base layer.

Once the sacrificial dielectric layer is formed, the sacrificial sidewall spacer can be selectively removed and, between the first vertical sidewall and the sacrificial dielectric layer, a trench can be formed extending vertically through the extrinsic base layer and the first dielectric layer to the intrinsic base layer. This trench can specifically be formed such that it conforms to a perimeter of the opening and has a second vertical sidewall aligned directly below the first vertical sidewall. This trench can further be formed, for example, by using the sacrificial dielectric layer as a mask and performing an anisotropic etch process.

Then, a conductive strap can be formed within the trench on the intrinsic base layer and adjacent to the second vertical sidewall such that it is essentially rectangular shape and further such that that it electrically connects the intrinsic base layer to the extrinsic base layer. For example, in-situ doped polysilicon can be deposited so as to fill the trench and then recessed so as to form the conductive strap. It should be noted that the recessing process can be performed to ensure that the resulting conductive strap does not extend vertically above the top surface of the extrinsic base layer.

Disclosed herein are additional process steps that can be incorporated into the method embodiments described above in order to improve yield. Specifically, the sacrificial dielectric layer must be formed thick enough to withstand various etch and cleaning processes and still remain intact to function as an etch stop layer when the conductive strap is formed (e.g., as described above, when in-situ doped polysilicon is deposited so as to fill the trench and then recessed so as to form the conductive strap).

One technique for forming a relatively thick dielectric layer and, particularly, a relatively thick oxide layer can comprise introducing (e.g., by implanting or other technique) a dopant into a section of a semiconductor layer to form a doped region (e.g., a dopant implant region). Then, an oxidation process (e.g., a high pressure, low temperature oxidation (HIPOX) process) can be performed in order to form an oxide layer on the top surface the semiconductor layer. The dopant is preselected so that it will enhance the oxidation process (i.e., so that it will increase the oxidation rate). Thus, the resulting oxide layer comprises a center portion, having a first thickness, adjacent to the section with the doped region and an outer edge portion, having a second thickness that is less than said first thickness extending laterally beyond that section.

This same technique can be used to ensure that the sacrificial dielectric layer required during formation of the above-described transistors is sufficiently thick. That is, after the sacrificial sidewall spacer (e.g., the sacrificial nitride spacer) is formed on the first vertical sidewall of the opening and before the sacrificial dielectric layer is formed on the polysilicon extrinsic base layer within the opening, a dopant can be introduced (e.g., implanted or otherwise introduced) into a section of the polysilicon base layer that remains exposed within the opening in order to form a doped region (e.g., a dopant implant region). Then, the sacrificial dielectric layer and, particularly, a sacrificial oxide layer can be formed on the top surface of the polysilicon extrinsic base layer within the opening by performing an oxidation process (e.g., a high pressure, low temperature, oxidation (HIPOX) process). Again, the dopant is preselected so that it will enhance the oxidation process (i.e., so that it will increase the oxidation rate). Thus, the resulting sacrificial oxide layer comprises a center portion, having a first thickness, adjacent to the section of the extrinsic base layer with the doped region and an outer edge portion, having a second thickness that is less than the first thickness, extending laterally beyond that section. Processing can then be performed as described above to complete the transistor structure.

BRIEF DESCRIPTION OF THE SEVERAL VIEWS OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As discussed above, it is desirable in bipolar transistors (BTs) and, particularly, in high performance heterojunction bipolar transistors (HBTs) to have a relatively high transit frequency $f_T$ and maximum oscillation frequency $F_{max}$. $F_{max}$ is a function of $f_T$ and of parasitics, including parasitic capacitances and parasitic resistances. Exemplary parasitics include, but are not limited to, collector-base capacitance $C_{cb}$, base-emitter $C_{be}$ capacitance and base resistance $R_b$. Thus, it would be advantageous to provide transistors structure, such as a BT structure or HBT structure, with reduced collector-base capacitance $C_{cb}$ and reduced base resistance $R_b$ as well as a method for forming such a structure.

Previously disclosed embodiments of the present invention included an improved transistor structure (e.g., a bipolar transistor (BT) structure or heterojunction bipolar transistor (HBT) structure) with a sidewall-defined conductive strap for an intrinsic base to extrinsic base link-up region and a method of forming such a transistor structure. The transistor structure embodiments can incorporate a dielectric layer sandwiched between an intrinsic base layer and a raised extrinsic base layer to reduce collector-base capacitance $C_{cb}$, a sidewall-defined conductive strap for an intrinsic base layer to extrinsic base layer link-up region to reduce base resistance $R_b$ and a dielectric spacer between the extrinsic base layer and an emitter layer to reduce base-emitter $C_{be}$ capacitance. The method embodiments allow for self-aligning of the emitter to base regions and further allow the geometries of different features (e.g., the thickness of the dielectric layer, the width of the conductive strap, the width of the dielectric spacer and the width of the emitter layer) to be selectively adjusted in order to selectively adjust the collector-base capacitance $C_{cb}$, the base resistance $R_b$ and the base-emitter $C_{be}$ capacitance, and thereby to optimize transistor performance.

Figure 1:
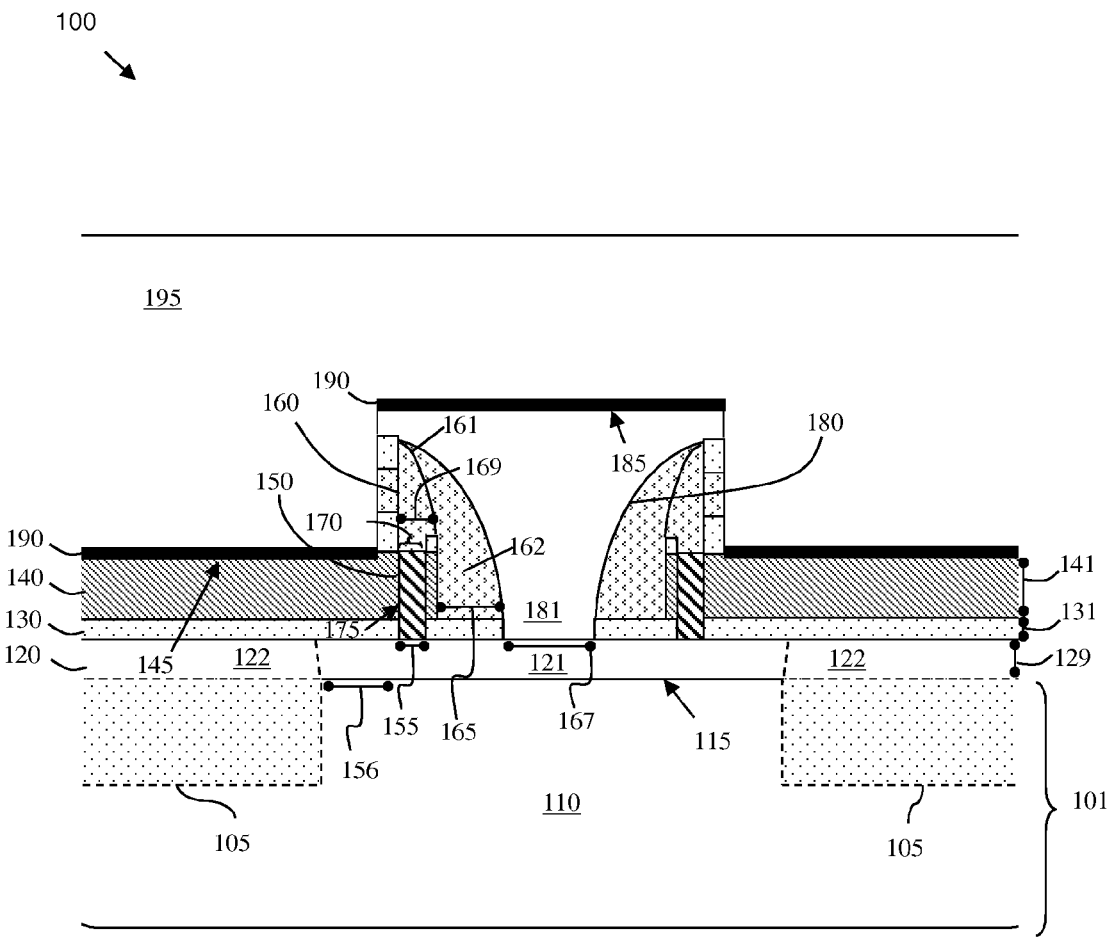
FIG. 1 is a cross-section view drawing illustrating embodiments of a transistor structure according to the present invention.

Specifically, referring to FIG. 1, embodiments of a transistor structure 100 (e.g., a BT structure or a HBT structure) according to the present invention can comprise a semiconductor substrate 101 having a first conductivity type (e.g., P-type conductivity). For example, the semiconductor substrate 101 can comprise a P-silicon (i.e., silicon lightly doped with a P-type dopant). The semiconductor substrate 101 can further comprise a collector region 110 having a second conductivity type different from the first type conductivity (e.g., N-type conductivity).

Various configurations for BT and HBT collector regions are well-known in the art and could be incorporated into the transistor structure 100a. For example, the collector region 110 can comprise a single N-well region. Alternatively, the collector region 110 can comprise multiple N-type collector components, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; a N–collector above the N+ buried collector and extending to the top surface of the substrate; and an N+ selective implant collector (SIC) pedestal within the N–collector immediately adjacent to the N+ buried collector and separated from the top surface of the substrate by some distance.

Shallow trench isolation (STI) regions 105 can optionally be positioned within and at the top surface 115 of the semiconductor substrate 101 to define the active area of the device. Specifically, the STI regions 105 can comprise relatively shallow trenches patterned and etched into the top surface of the substrate 101 around (i.e., bordering) an area designated as the active area of the device. The trenches can be lined (optionally) and filled with one or more isolation materials (e.g., a silicon oxide material, a silicon nitride material, a silicon oxynitride material or any other suitable isolation material or combination thereof).

An intrinsic base layer 120 having the first conductivity type (e.g., P-type conductivity) can be positioned on the top surface 115 of the semiconductor substrate 101 over the collector region 110 and, if applicable, extending laterally over the STI regions 105. The intrinsic base layer 120 can comprise an epitaxial semiconductor layer, can have a predetermined thickness 129 (e.g., a thickness of 0.01-0.02 µm, a thickness of approximately 0.015 µm, etc.) and can be doped with a predetermined concentration of a P-type dopant (e.g., a concentration of $1.0 \times 10^{13}$-$6.0 \times 10^{13}$ atoms/cm³, a concentration of approximately $4.0 \times 10^{13}$ atoms/cm³, etc.).

In the case of a BT structure, the intrinsic base layer 120 can comprise an epitaxial silicon layer. This epitaxial silicon layer can comprise at least a first section 121 comprising single crystalline silicon immediately above the top surface 115 of the substrate 101 and, if applicable (i.e., if the intrinsic base layer 120 extends laterally over the STI regions 105), a second section 122 comprising polycrystalline silicon above the STI regions 105.

Alternatively, in the case of a HBT structure, the intrinsic base layer 120 can comprise an epitaxial silicon germanium layer. This epitaxial silicon germanium layer can comprise at least a first section 121 comprising single crystalline silicon germanium immediately above the top surface 115 of the substrate 101 and, if applicable (i.e., if the intrinsic base layer 120 extends laterally over the STI regions 105), a second section 122 comprising polycrystalline silicon germanium on the STI regions 105. Additionally, in the case of a HBT, the epitaxial silicon germanium intrinsic base layer 120 can also have a germanium concentration profile that is graded, stepped or otherwise non-uniform to improve device performance. For example, having a graded germanium concentration profile with a steep ramp up at the bottom surface of the intrinsic base layer, a plateau and a steady ramp down towards the top surface of the intrinsic base layer can be used to create a quasi-drift field. This quasi-drift field will accelerate movement of minority carriers (e.g., electrons) through the intrinsic base layer, thereby, increasing the current gain frequency ($f_T$).

Optionally, the intrinsic base layer 120 can be doped with a low concentration of carbon atoms to prevent dopant out-diffusion (e.g., P-type dopant outdiffusion).

A dielectric layer 130 can be positioned on the intrinsic base layer 120 and can have a predetermined thickness 131 (e.g., a thickness of 0.01-0.02 μm, a thickness of approximately 0.0150 μm, etc.). The dielectric layer 130 can comprise, for example, an oxide layer (e.g., a silicon oxide layer or silicon germanium oxide layer, depending upon the intrinsic base layer 120).

Additionally, a raised extrinsic base layer 140 having the same conductivity type as the intrinsic base layer 120 (e.g., P-type conductivity) can be positioned on the dielectric layer 130 and can have a predetermined thickness 141 (e.g., a thickness of 0.08-0.14 μm, a thickness of approximately 0.12 μm, etc.). The raised extrinsic base layer 140 can, for example, comprise an epitaxial semiconductor layer (e.g., an epitaxial polysilicon layer) doped with a relatively high predetermined concentration of a P-type dopant. For example, the concentration of P-type dopant in the raised extrinsic base layer 140 can be greater than that in the intrinsic base layer 120 (e.g., a concentration of $4.0 \times 10^{16}$-$3.5 \times 10^{20}$ atoms/$cm^3$, a concentration of approximately $3.0 \times 10^{20}$ atoms/$cm^3$, etc.).

It should be noted that the dielectric layer 130 physically separates the intrinsic base layer 120 from the raised extrinsic base layer 140 and the thickness 131 of the dielectric layer 130 is predetermined in order to achieve a given collector-base capacitance $C_{cb}$ (i.e., during formation, the thickness 131 of the dielectric layer 130 is selectively adjusted in order to selectively adjust the collector-base capacitance $C_{cb}$).

Additionally, a trench 170 can extend through the raised extrinsic base layer 140 and the dielectric layer 130 to the intrinsic base layer 120. Thus, the trench 170 has a sidewall 175. The sidewall 175 can be an essentially vertical sidewall, as shown. Alternatively, the sidewall can be tapered, curved, angled, etc. A self-aligned conductive strap 150 (i.e., a conductor, a conductive strip region, etc.) can be positioned within the trench 170 on the intrinsic base layer 120 and adjacent to the sidewall 175 such that it electrically connects the intrinsic base layer 120 to the extrinsic base layer. Note, that if the sidewall 175 is vertical, the strap 150 will be essentially rectangular in shape.

Specifically, the conductive strap 150 can comprise a semiconductor material (e.g., polysilicon) doped with a relatively high concentration of a same conductivity type dopant as the intrinsic and extrinsic base layers 120, 140 (e.g., a P-type dopant). For example, the concentration of P-type dopant in the conductive strap 150 can be approximately equal to the concentration of P-type dopant in the raised extrinsic base layer 140 (e.g., a concentration of $4.0 \times 10^{16}$-$3.5 \times 10^{20}$ atoms/$cm^3$, a concentration of approximately $3.0 \times 10^{20}$ atoms/$cm^3$, etc.). Alternatively, the conductive strap 150 can comprise any other suitable highly conductive material (e.g., a metal or metal alloy). Additionally, this conductive strap 150 can be essentially rectangular in shape. It can be positioned laterally immediately adjacent to the vertical sidewall 175 of the trench 170. It can further extend vertically from the intrinsic base layer 120 to no higher than the top surface 125 of the raised extrinsic base layer 140 so as to electrically connect the intrinsic base layer 120 and, particularly, the first section 121 (i.e., the single crystalline section) of the intrinsic base layer 120 to the raised extrinsic base layer 140. Thus, for example, if the dielectric layer 130 has a thickness of 0.015 μm and the extrinsic base layer 140 has a thickness of 0.12 μm, then the height of the conductive strap 150 will be approximately equal to and no greater than 0.135 μm. Additionally, the trench 170 and, thereby the conductive strap 150 can have a predetermined width 155 (e.g., a width of 0.04-0.09 μm, a width of approximately 0.05 μm, etc.) in order to achieve a given base resistance $R_b$ (i.e., during formation, the width 155 of the conductive strap 150 is selectively adjusted in order to selectively adjust the base resistance $R_b$).

The embodiments of the transistor structure 100 can further comprise a multi-layered, dielectric spacer 160 (e.g., a silicon nitride spacer) and an emitter layer 180. Specifically, the dielectric spacer 160 can have a first portion 161 (i.e., a first layer) positioned on (i.e., above) and covering at least the top surface of the conductive strap 150. The dielectric spacer 160 can further have a second portion 162 (i.e., a second layer) positioned on (i.e., above) the dielectric layer 130 and further positioned laterally adjacent to both the first portion 161 and the extrinsic base layer 140. The emitter layer 180 can be positioned on (i.e., above) the intrinsic base layer 120 and can further be positioned laterally adjacent to the dielectric layer 130 and the dielectric spacer 160 such that the dielectric layer 130 and the dielectric spacer 160 electrically isolate the emitter layer 180 from the conductive strap 150 and extrinsic base layer 140.

It should be noted that the geometry of the emitter layer 180 is essentially defined by the dielectric spacer 160 because, as discussed in greater detail below, during processing the dielectric spacer 160 functions as a mask for defining an emitter layer through the dielectric layer 130 to the intrinsic base layer 120 and, thereby for defining the width (i.e., the diameter) of the relatively narrow lower portion 181 of the emitter layer 180 that is in contact with the intrinsic base layer 120. The lower portion 181 can have a predetermined width 167 (e.g., a width of 0.05-0.125 μm, a width of approxiamtely 0.1 μm, etc.) in order to achieve a given area ratio between the emitter layer 180 and the intrinsic base layer 120.

The emitter layer 180 can comprise a polycrystalline semiconductor layer. For example, in the case of either a BT structure or HBT structure, the emitter layer 180 can comprise a polysilicon layer. However, in the case of an HBT structure, the emitter layer 180 can alternatively comprise a polycrystalline silicon germanium layer. This emitter layer 180 can further have the same conductivity type as the collector region 110 (e.g., N-type conductivity). Specifically, it can be heavily doped with an N-type dopant.

It should be noted that the second portion 162 of the dielectric spacer 160 (particularly between the lower portion 181 of the emitter layer 180 and the extrinsic base layer 140) can also have a predetermined width 165 (e.g., a width of 0.05-0.125 μm, a width of approximately 0.1 μm, etc.) in order to achieve both a given base-emitter $C_{be}$ capacitance and, in conjunction with the width 155 of the conductive strap 150, the given base resistance $R_b$(i.e., during formation, the width 165 of the second portion 162 of the dielectric spacer 160 can be selectively adjusted in order to selectively adjust base-emitter $C_{be}$ capacitance and, in conjunction with the width 155 of the conductive strap 150, to selectively adjust base resistance $R_b$).

Additional features of the above-described transistor structure embodiments can include silicide layers 190 on the top surfaces 125, 185 of the raised extrinsic base layer 140 and emitter layer 180, an interlayer dielectric 195 on the silicide layers 190, contacts (not shown), deep trench isolation (DTI) structures (not shown), etc.

It should also be understood that in the transistor structure embodiments, described in detail above, any component having an N-type conductivity will comprise (e.g., will be doped with, implanted with, etc.) an N-type conductivity dopant and any component having a P-type conductivity will comprise (e.g., will be doped with, implanted with, etc.) a P-type conductivity dopant. Such N-type conductivity dopants can comprise, for example, Group V dopants, such as arsenic (As), phosphorous (P) or antimony (Sb) and such P-type conductivity dopants can comprise, for example, Group III dopants, such as boron (B) or indium (In)).

Figure 2:
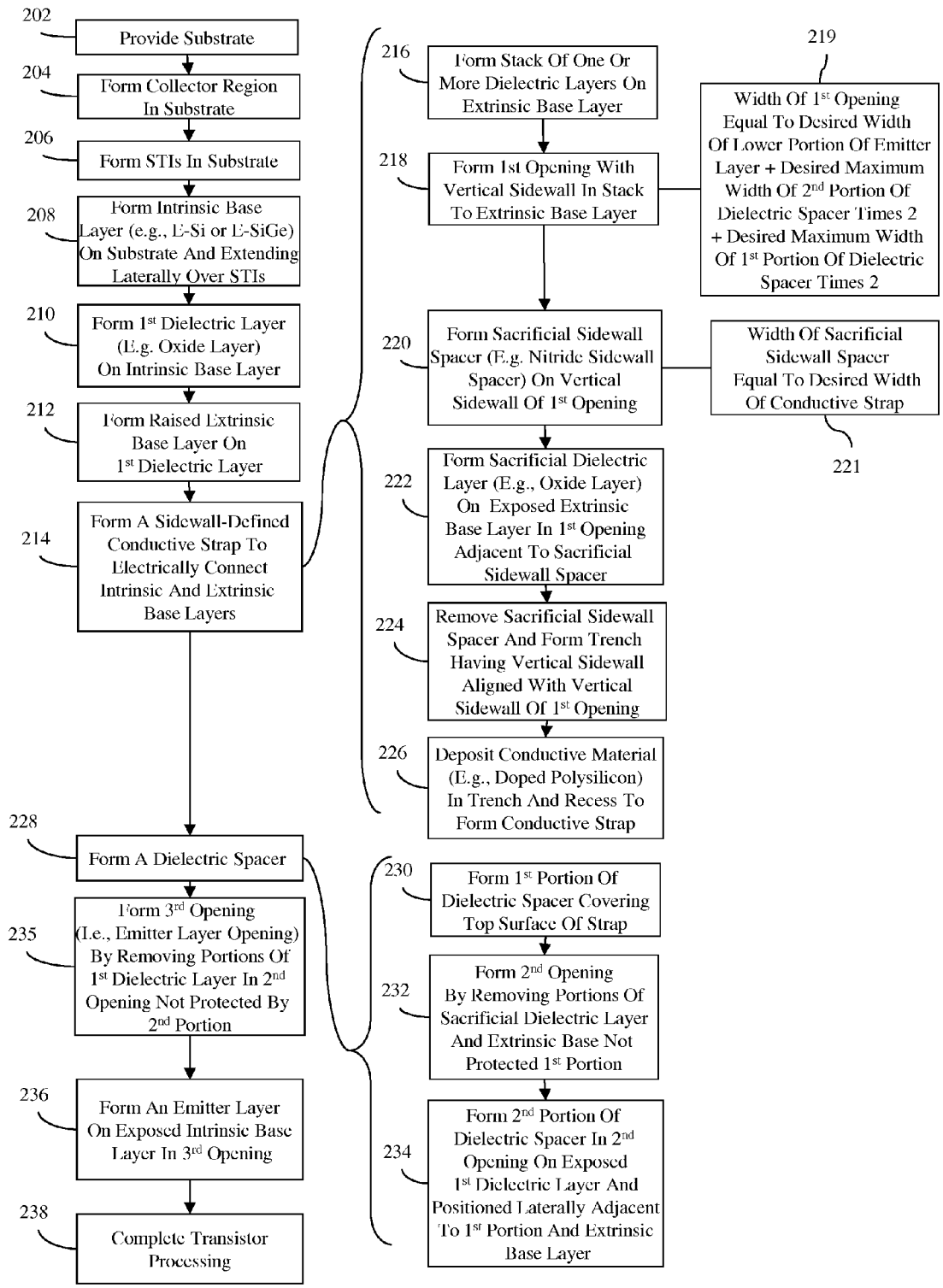
FIG. 2 is a flow-diagram illustrating embodiments of a method of forming a transistor structure according to the present invention.
Figure 3:
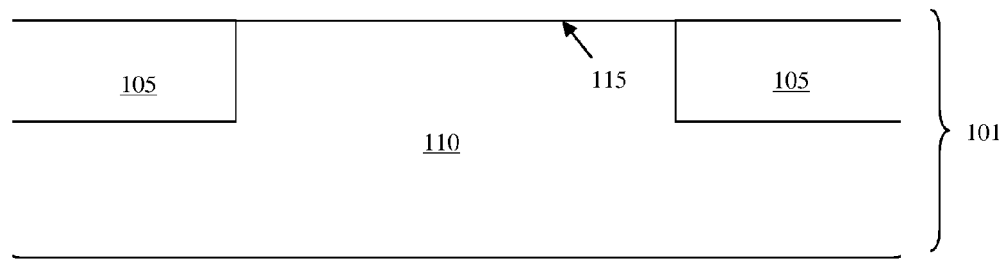
FIG. 3 is a cross-section view of a partially completed bipolar transistor structure formed according to the method of FIG. 2.

Referring to FIG. 2, embodiments of a method of forming a transistor structure (e.g., a BT structure or a HBT structure) according to the present invention can comprise providing a single crystalline semiconductor substrate 101 having a first conductivity type (e.g., a P-type conductivity) (202, see FIG. 3). For example, the provided semiconductor substrate 101 can comprise P-silicon (i.e., single crystalline silicon lightly doped with a P-type dopant).

A collector region 110 having a second conductivity type different from the first type conductivity (e.g., N-type conductivity) can be formed within the semiconductor substrate 101 (204, see FIG. 3). Various configurations for BT and HBT collector regions are well-known in the art. For example, a collector region 110 can comprise a single N-well region. Alternatively, a collector region 110 can comprise multiple N-type collector components formed within the substrate, such as the following components described and illustrated in U.S. Patent Publication No. 2008/0265282 of Gluschenkov et al., published on Oct. 30, 2008, assigned to International Business Machines Corporation, and incorporated herein by reference: an N+ buried collector within the substrate; an N– collector above the N+ buried collector and extending to the top surface of the substrate; and an N+ selective implant collector (SIC) pedestal within the N–collector immediately adjacent to the N+ buried collector and separated from the top surface of the substrate by some distance. Techniques for forming such collector regions within a semiconductor substrate are also well-known in the art. Thus, the details are omitted from this specification in order to allow the reader to focus on the salient aspects of the embodiments described.

Conventional shallow trench isolation (STI) formation techniques can be used to form optional shallow trench isolation (STI) regions 105 within and at the top surface 115 of the semiconductor substrate 101 in order to define the active area of the device (206, see FIG. 3). For example, relatively shallow trenches can be patterned and etched into the top surface of the substrate 101 around (i.e., bordering) an area designated as the active area for the device. The trenches can be lined (optionally) and filled with one or more isolation materials (e.g., a silicon oxide material, a silicon nitride material, a silicon oxynitride material or any other suitable isolation material or combination thereof).

Figure 4:
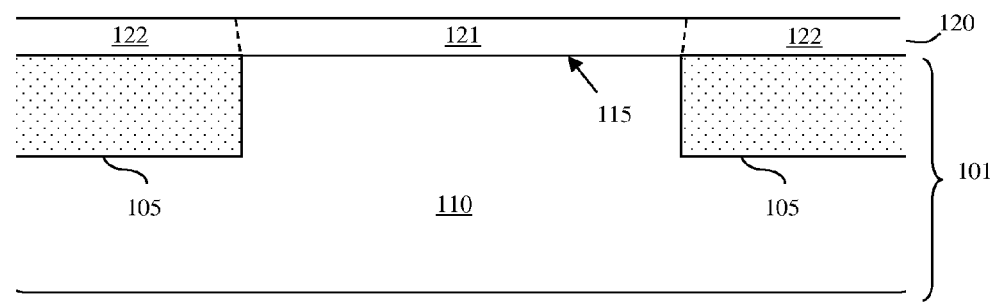
FIG. 4 is a cross-section view of a partially completed bipolar transistor structure formed according to the method of FIG. 2.

Next, an intrinsic base layer 120 having the first conductivity type (e.g., P-type conductivity) can be formed on the top surface 115 of the single crystalline semiconductor substrate 101 over the collector region 110 and, if applicable (i.e., if STI regions 105 are formed at process 206), extending laterally over the STIs 105 (208, see FIG. 4). In order to form this intrinsic base layer 120, an epitaxial semiconductor layer can be formed using a conventional epitaxial deposition process.

For example, in the case of a BT transistor, an epitaxial silicon layer can be formed with a first section 121 above and in contact with the top surface 115 of the single crystalline semiconductor substrate 101 and comprising single crystalline silicon and, if applicable (i.e., if the intrinsic base layer 120 extends laterally over STIs 105), with a second section 122 above the STIs 105 and comprising polycrystalline silicon. Alternatively, in the case of a HBT structure, an epitaxial silicon germanium layer can be formed with a first section 121 above and in contact with the top surface 115 of the single crystalline semiconductor substrate 101 and comprising single crystalline silicon germanium and, if applicable (i.e., the intrinsic base layer 120 extends laterally over STIs 105), with a second section 122 above the STIs 105 and comprising polycrystalline silicon germanium. The germanium concentration profile in such an intrinsic base layer can be graded, stepped or otherwise non-uniform to improve device performance. For example, having a graded germanium concentration profile with a steep ramp up at the bottom surface of the intrinsic base layer, a plateau and a steady ramp down towards the top surface of the intrinsic base layer can be used to create a quasi-drift field. This quasi-drift field will accelerate movement of minority carriers (e.g., electrons) through the intrinsic base layer, thereby, increasing the current gain frequency ($f_T$).

The intrinsic base layer 120 can further be formed such that it has a predetermined thickness 129 (e.g., a thickness of 0.01-0.02 µm, a thickness of approximately 0.015 µm, etc.). To achieve the P-type conductivity, the intrinsic base layer 120 can be either in-situ doped or subsequently implanted with a predetermined concentration of a P-type dopant (e.g., a concentration of $1.0 \times 10^{13}$-$6.0 \times 10^{13}$ atoms/cm$^3$, a concentration of approximately $4.0 \times 10^{13}$ atoms/cm$^3$, etc.). To prevent dopant outdiffusion (e.g., P-type dopant outdiffusion), the intrinsic base layer 120 can also be doped with a low concentration of carbon atoms.

Figure 5:
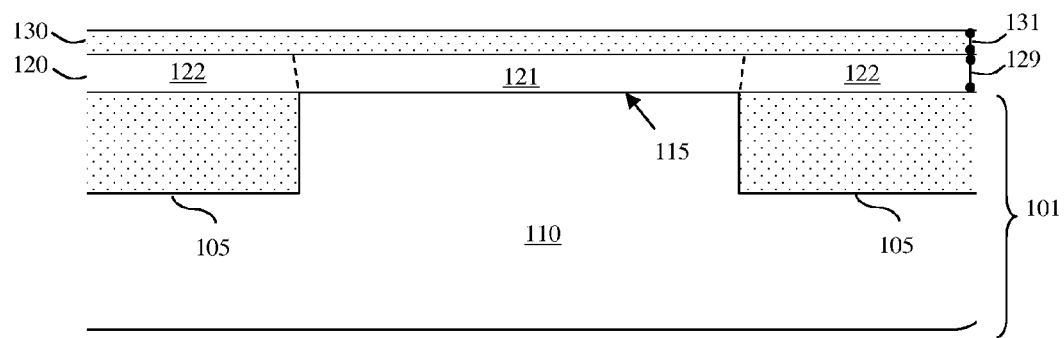
FIG. 5 is a cross-section view of a partially completed bipolar transistor structure formed according to the method of FIG. 2.

Next, a first dielectric layer 130 can be formed on the intrinsic base layer 120 (210, see FIG. 5). For example, a conventional oxide deposition or oxidation process can be performed in order to form, on the intrinsic base later 120, a first oxide layer (e.g., a silicon oxide layer or silicon germanium oxide layer, depending upon the intrinsic base layer 120) having a predetermined thickness 131 (e.g., a thickness of 0.01-0.02 µm, a thickness of approximately 0.0150 µm, etc.).

Figure 6:
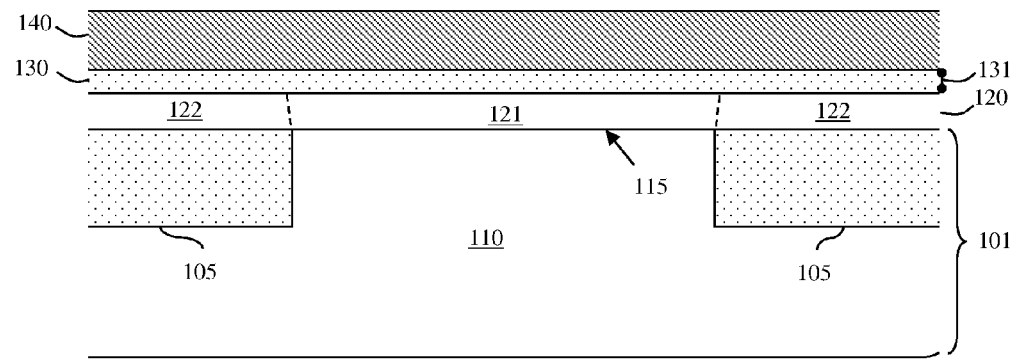
FIG. 6 is a cross-section view of a partially completed bipolar transistor structure formed according to the method of FIG. 2.

Additionally, a raised extrinsic base layer 140 having the same conductivity type as the intrinsic base layer 120 (e.g., P-type conductivity) can be formed on the first dielectric layer 130 (212, see FIG. 6). For example, a conventional epitaxial deposition process can be used to form, on the first dielectric layer 130, an epitaxial semiconductor layer (e.g., an epitaxial polysilicon layer) having a predetermined thickness 141 (e.g., a thickness of 0.08-0.14 µm, a thickness of approximately 0.12 µm, etc.). To achieve the P-type conductivity, the extrinsic base layer 120 can be either in-situ doped or subsequently implanted with a relatively high concentration of a P-type dopant. Specifically, the extrinsic base layer 140 can be in-situ doped or subsequently implant so that the concentration of P-type dopant in the extrinsic base layer 140 (e.g., a concentration of $4.0\times10^{16}$-$3.5\times10^{20}$ atoms/cm$^3$, a concentration of approximately $3.0\times10^{20}$ atoms/cm$^3$, etc.) is greater than that in the intrinsic base layer 120.

It should be noted that the dielectric layer 130 physically separates the intrinsic base layer 120 from the extrinsic base layer 140 and the thickness 131 of the dielectric layer 130 can be predetermined in order to achieve a given collector-base capacitance $C_{cb}$ (i.e., the thickness 131 of the first dielectric layer 130 can be selectively adjusted at process 210 in order to selectively adjust the collector-base capacitance $C_{cb}$).

The method embodiments can further comprise forming a self-aligned (i.e., sidewall-defined), conductive strap 150 (i.e., a conductor, a conductive strip region, etc.) positioned on the intrinsic base layer 120 and, particularly, on the first section 121 (i.e., the single crystalline section) of the intrinsic base layer 120 and further positioned laterally immediately adjacent to a sidewall 175 of the extrinsic base layer 140 and the first dielectric layer 130 such that it electrically connects the intrinsic base layer 120 to the extrinsic base layer 140 (214, see FIG. 1). This conductive strap 150 can be essentially rectangular in shape and can be made of doped polysilicon having the same conductivity type as the intrinsic and extrinsic base layers (e.g., P-type conductivity) or any other suitable conductor material.

Figure 7:
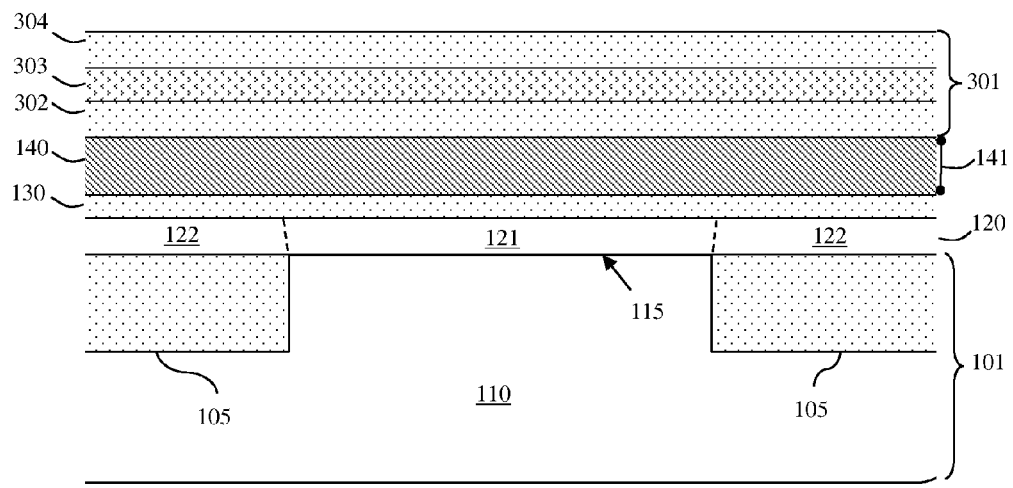
FIG. 7 is a cross-section view of a partially completed bipolar transistor structure formed according to the method of FIG. 2.

More particularly, to form this conductive strap 150 at process 214, conventional deposition processes can be used to form at least one second dielectric layer and, preferably, a stack 301 of dielectric layers on the extrinsic base layer 140 (216, see FIG. 7). For example, a second oxide layer 302 (e.g., a silicon oxide layer) that is approximately 0.05-0.2 µm thick and, preferably, 0.12 µm thick, can be formed on the extrinsic base layer 140. Next, a nitride layer 303 (e.g., a silicon nitride layer) that is approximately 0.1-0.3 µm thick and, preferably, 0.17 µm thick, can be formed on the second oxide layer 302. Finally, a third oxide layer 304 (e.g., another silicon oxide layer) that is approximately 0.05-0.2 µm thick and, preferably, 0.12 µm thick, can be formed on the nitride layer 303.

Figure 8:
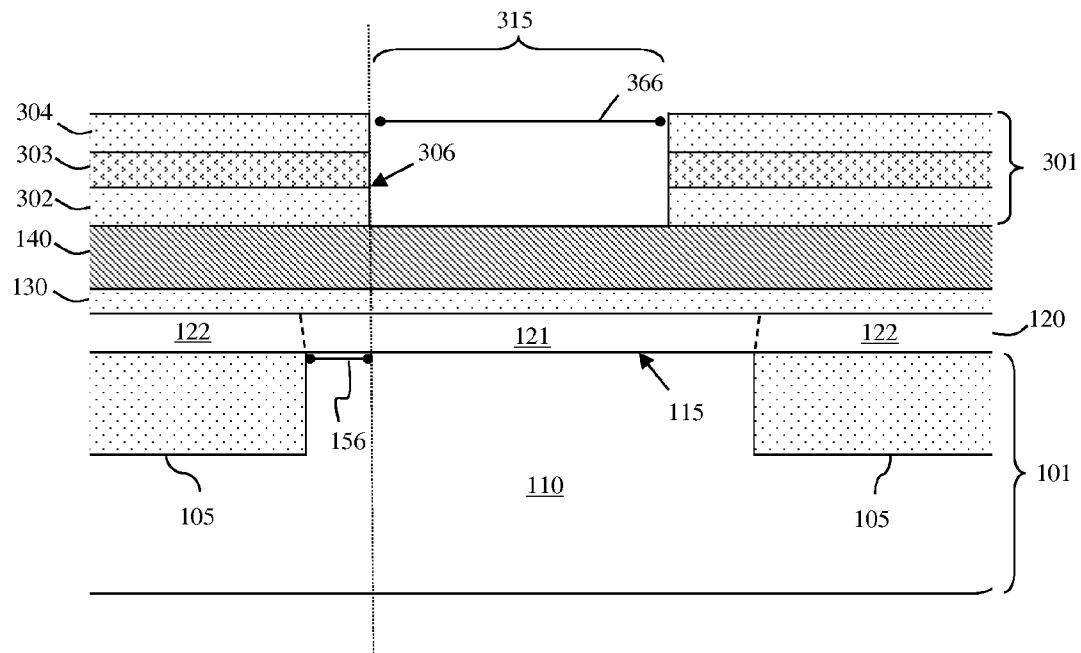
FIG. 8 is a cross-section view of a partially completed bipolar transistor structure formed according to the method of FIG. 2.

Next, a first opening 315 can be formed so that it extends vertically through the through the stack 301 down to the extrinsic base layer 140 (218, see FIG. 8). Thus, the first opening 315 has a first vertical sidewall 306. Specifically, to form the first opening 315 at process 218, a masking step can be used to pattern this first opening 315 so that it is positioned above the collector region 110 and first section 121 (i.e., single crystalline section) of the intrinsic base layer 120. It can further be patterned so that it has a predetermined geometry (including a width 366), so that it is essentially centered between the STI regions 105 and so that the first vertical sidewall 306 will be spaced laterally some predetermined distance 156 away from a closest STI region 105. Then, one or more anisotropic etch processes (e.g., reactive ion etch (RIE) processes) can be used to etch through the one or more dielectric layers above the extrinsic base layer 140. See the detail discussion below regarding the geometry, including the predetermined width 366, of this first opening 315.

Figure 9:
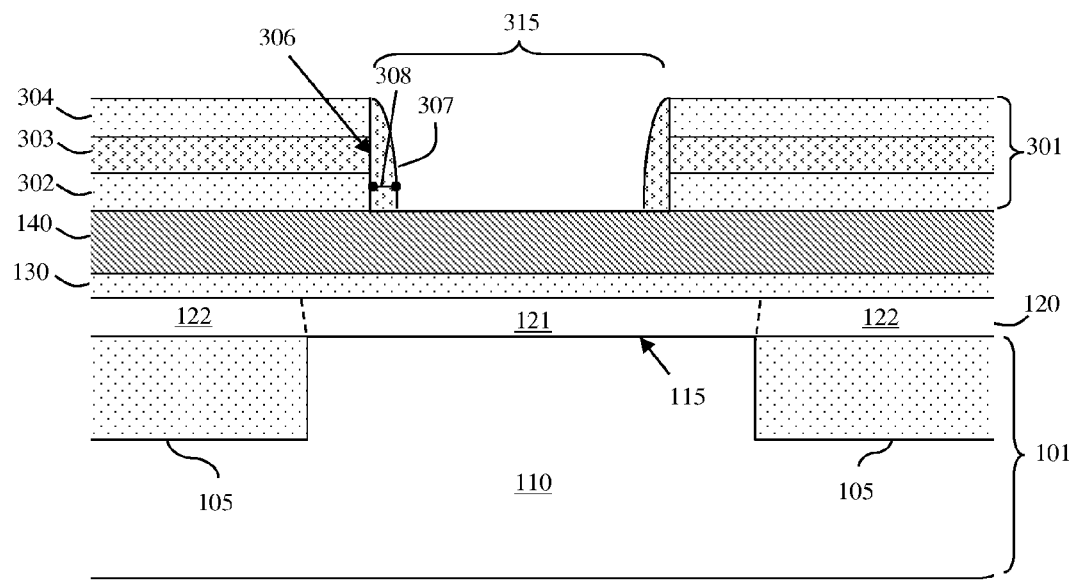
FIG. 9 is a cross-section view of a partially completed bipolar transistor structure formed according to the method of FIG. 2.

After the first opening 315 is formed at process 218, a sacrificial sidewall spacer 307 (e.g., a sacrificial silicon nitride spacer), having a predetermined width 308, can be formed on the first vertical sidewall 306, using conventional sidewall spacer formation techniques (220, see FIG. 9). For example, an approximately 0.04-0.06 µm thick and, preferably, an approximately 0.04 µm thick silicon nitride layer can be deposited and, then, etched back to form the sacrificial nitride sidewall spacer 307. See detail discussion below regarding the predetermined width 308 of the sacrificial sidewall spacer 307.

Figure 10:
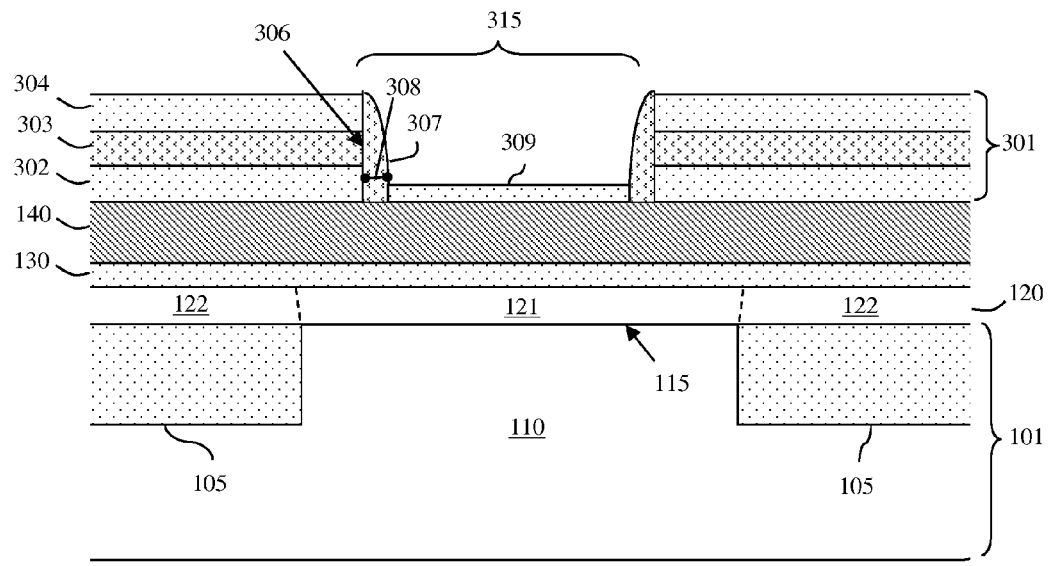
FIG. 10 is a cross-section view of a partially completed bipolar transistor structure formed according to the method of FIG. 2.

Then, a sacrificial dielectric layer 309 can be formed on an exposed surface of the extrinsic base layer 140 within the first opening 315 adjacent to the sacrificial sidewall spacer 307 (222, see FIG. 10). For example, an oxidation process can be performed in order to form a sacrificial oxide layer with a thickness of 0.03-0.05 µm and, preferably, with a thickness of approximately 0.04 µm, on the exposed surface of the extrinsic base layer 140. It should be noted that, with such a process, oxidation will not occur under the sacrificial sidewall spacer 307 due to stress.

Figure 11:
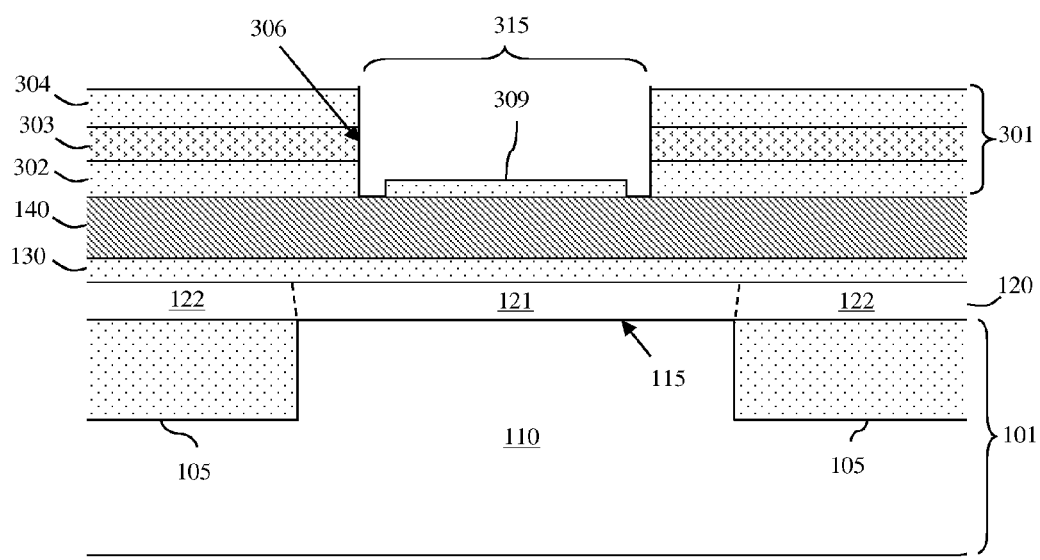
FIG. 11 is a cross-section view of a partially completed bipolar transistor structure formed according to the method of FIG. 2.
Figure 12:
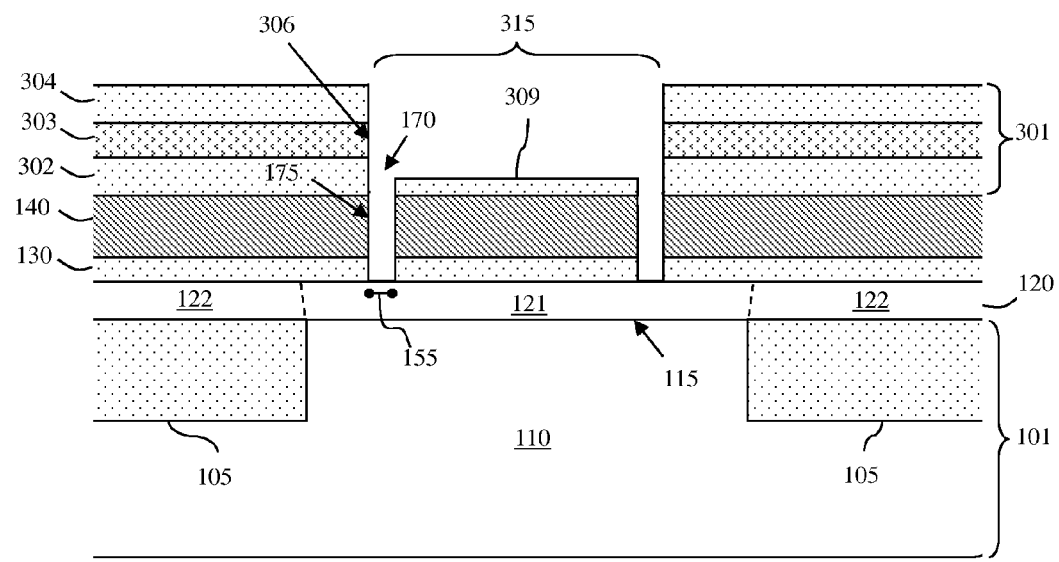
FIG. 12 is a cross-section view of a partially completed bipolar transistor structure formed according to the method of FIG. 2.

Once the sacrificial dielectric layer 309 is formed at process 222, the sacrificial sidewall spacer 307 can be selectively removed (see FIG. 11). Then, between the first vertical sidewall 306 and the sacrificial dielectric layer 309 within the first opening 315, a trench 170 can be formed that extends through the extrinsic base layer 140 and the first dielectric layer 130 to the intrinsic base layer 120 and, particularly, to the first section 121 of the intrinsic base layer 120 (224, see FIG. 12). This trench 170 can be formed by using the sacrificial dielectric layer 309 as a mask and performing an anisotropic etch process (e.g., a reactive ion etch (RIE) process). Thus, the resulting trench 170 will conform to the perimeter of the first opening 315 (i.e., such that it is essentially annular with respect to the first opening 315), will land on the first section 121 (i.e., the single crystalline silicon section) of the intrinsic base layer 120, will have a second sidewall 175 aligned directly below the first vertical sidewall 306 of the first opening 315 and will have a width 155 that is approximately equal to the width 308 of the sacrificial sidewall spacer 307. Preferably, this trench 170 will be etched such that the second sidewall 175 is essentially vertically. However, alternatively, this trench 170 can be etched such that the second sidewall is tapered, curved, angled, etc.

Figure 13:
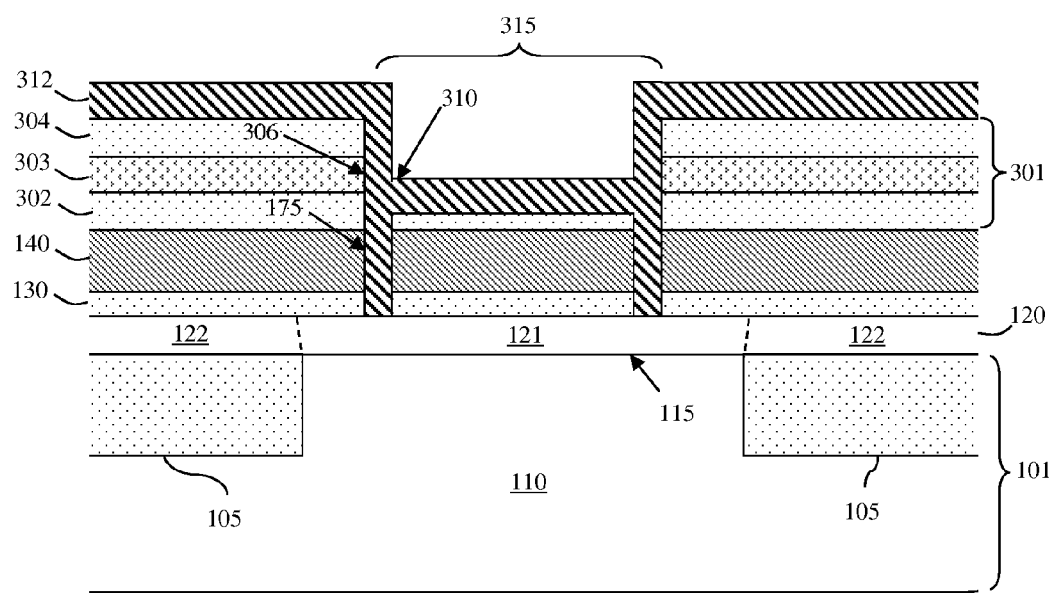
FIG. 13 is a cross-section view of a partially completed bipolar transistor structure formed according to the method of FIG. 2.

Next, a conductive strap 150 can be formed within the trench 170 such that it is positioned on the intrinsic base layer 120 and, particularly, on the first section 121 (i.e., the single crystalline section) of the intrinsic base layer 120 and also positioned laterally immediately adjacent to the second sidewall 175. Thus, the conductive strap 150 will electrically connect the intrinsic base layer 120 and, particularly, the first section 121 (i.e., the single crystalline section) of the intrinsic base layer 120 to the raised extrinsic base layer 140 (226, see FIGS. 13-14). Furthermore, if the second sidewall 175 is vertically, the conductive strap 150 will be essentially rectangular shape (i.e., in cross-section).

Figure 14:
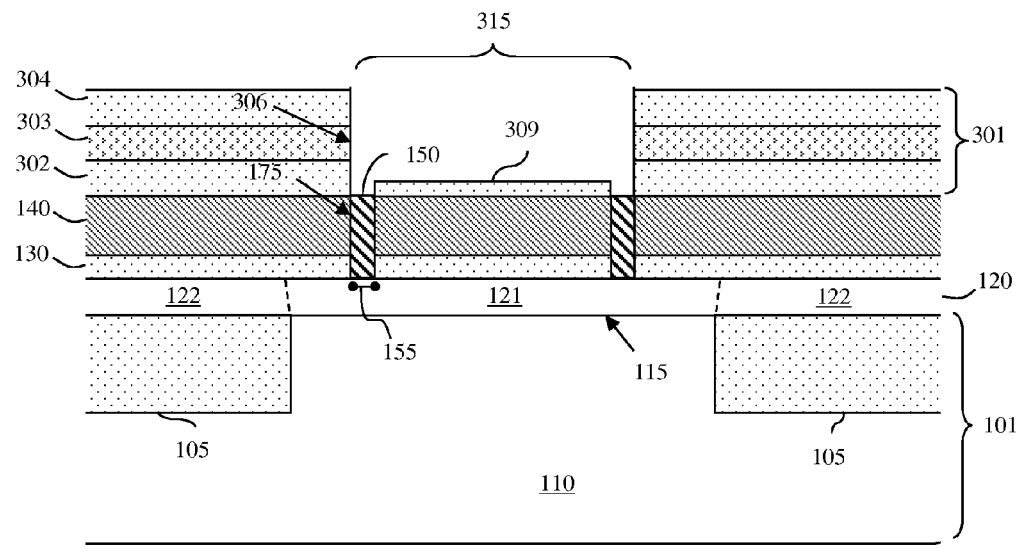
FIG. 14 is a cross-section view of a partially completed bipolar transistor structure formed according to the method of FIG. 2.

For example, conductive material 312 can be deposited so as to fill the trench 170 (see FIG. 13) and then recessed (i.e., etched back) so as to form the conductive strap 150 that is positioned laterally immediately adjacent to the second vertical sidewall 175, that is essentially rectangular in shape and that electrically connects the intrinsic base layer 120 to the raised extrinsic base layer 140 (see FIG. 14). The conductive material 312 deposited at process 226 can comprise a semiconductor material (e.g., polysilicon) in-situ doped with a relatively high concentration (e.g., a concentration of $4.0\times10^{16}$-$3.5\times10^{20}$ atoms/cm$^3$, a concentration of approximately $3.0\times10^{20}$ atoms/cm$^3$, etc.) of a same conductivity type dopant as the intrinsic and extrinsic base layers 120, 140 (e.g., a P-type dopant). Alternatively, the deposited conductive material can comprise any other suitable highly conductive material (e.g., a metal or metal alloy).

Additionally, the process of recessing the conductive material 312 can be performed in order to ensure that the conductive material 312 (e.g., the doped polysilicon) and, thereby, the resulting conductive strap 150 does not extend vertically above the top surface 145 of the raised extrinsic base layer 140. Thus, for example, if the first dielectric layer 130 has a thickness 131 of 0.015 μm and the extrinsic base layer 140 has a thickness 141 of 0.12 μm, then the height of the conductive strap 150 will be approximately equal to and no greater than 0.135 μm.

As mentioned above, the width 155 of the trench 170 formed at process 224 is approximately equal to the width 308 of the sacrificial sidewall spacer 307 formed at process 220. Thus, the conductive strap 150 formed at process 226 in the trench 170 will also have the same width 155 that is approximately equal to the width 308 of the sacrificial sidewall spacer 307. Therefore, in the method embodiments disclosed herein the sacrificial sidewall spacer 307 can be formed at process 220 to have a predetermined width 308 (e.g., a width of 0.04-0.09 μm, a width of approximately 0.05 μm, etc.) so that the conductive strap 150 formed at process 226 will have essentially the same predetermined width (e.g., a width of 0.04-0.09 μm, a width of approximately 0.05 μm, etc.) in order to achieve a given base resistance $R_b$ (i.e., the width 308 of the sacrificial sidewall spacer 307 and, thereby the width 155 of the conductive strap 150 can be selectively adjusted in order to selectively adjust base resistance $R_b$) (221).

Figure 15:
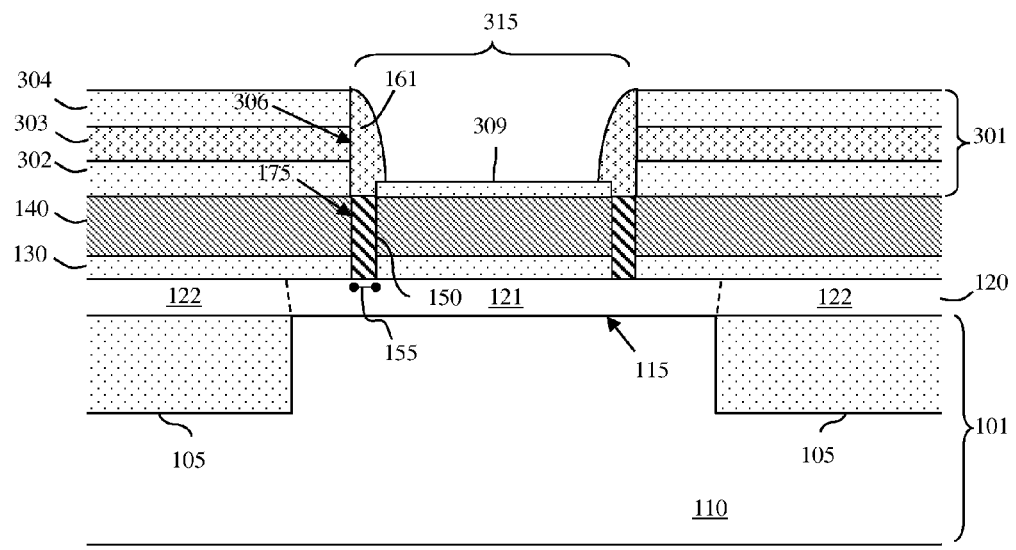
FIG. 15 is a cross-section view of a partially completed bipolar transistor structure formed according to the method of FIG. 2.
Figure 16:
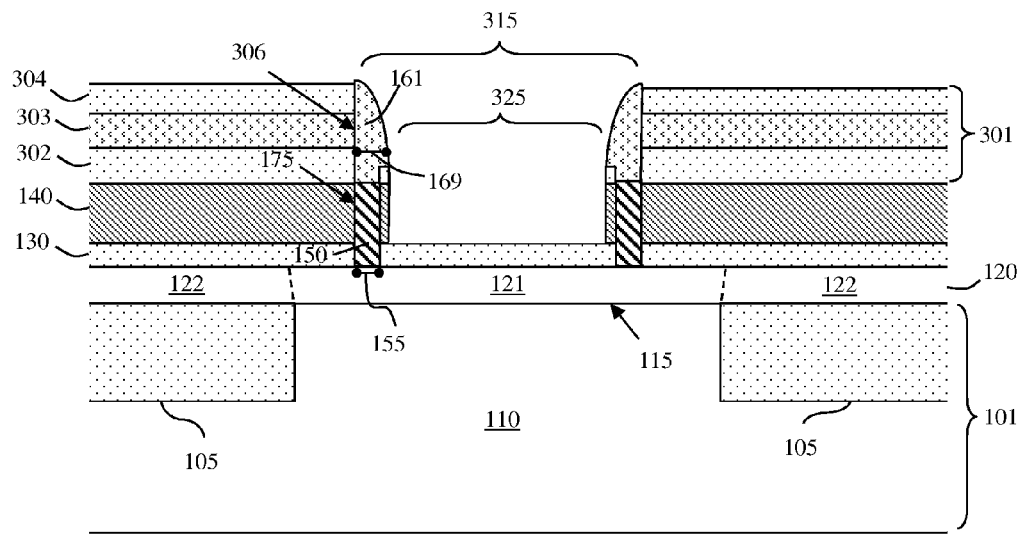
FIG. 16 is a cross-section view of a partially completed bipolar transistor structure formed according to the method of FIG. 2.
Figure 17:
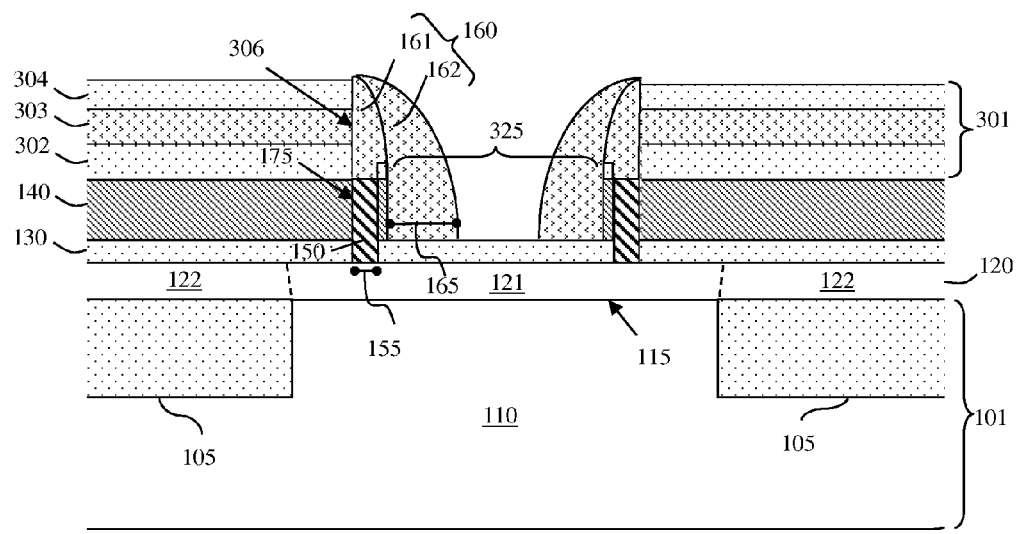
FIG. 17 is a cross-section view of a partially completed bipolar transistor structure formed according to the method of FIG. 2.

After the conductive strap 150 is formed at process 226, a dielectric spacer 160 can be formed (228, see FIG. 1). Specifically, after the conductive strap 150 is formed at process 226, conventional sidewall spacer formation techniques can be used to form a first portion 161 of a dielectric spacer 160 on the first vertical sidewall 306 of the first opening 315 so that it is above the conductive strap 150 (230, see FIG. 15). For example, an approximately 0.05 μm nitride layer can be deposited and an anisotropic etch process (e.g., a reactive ion etch (RIE) process) can be performed in order to shape the first portion 161 of the dielectric spacer. The maximum width 169 of the first portion 161 should be equal to and, preferably, slightly greater than (e.g., by 0.005 μm) the width 155 of the conductive strap 150 so that the top surface of the conductive strap is entirely covered, as illustrated. Next, a second opening 325 can be formed within the first opening 315 by selectively removing exposed portions of the sacrificial dielectric layer 309 and the extrinsic base layer 140 not protected by the first portion 161 of the dielectric spacer 160 (232, see FIG. 16). This can be accomplished by performing selective anisotropic etch processes (e.g., selective reactive ion etch (RIE) processes), stopping on the first dielectric layer 130. Then, a second portion 162 of the dielectric spacer 160 can be formed in the second opening 325 on the exposed first dielectric layer 130 and positioned laterally adjacent to the first portion 161 and the extrinsic base layer 140 (234, see FIG. 17). This can be accomplished, for example, by depositing an approximately 0.01-0.1 μm silicon nitride layer and performing an anisotropic etch process (e.g., a reactive ion etch (RIE) process) in order to shape the second portion 161 of the dielectric spacer 160. Those skilled in the art will recognize that the thickness of this silicon nitride layer will vary depending upon the desired width 165 for the second portion 162. See detailed discussion below regarding the width 165 of the second portion 162 of the dielectric spacer 160.

Figure 18:
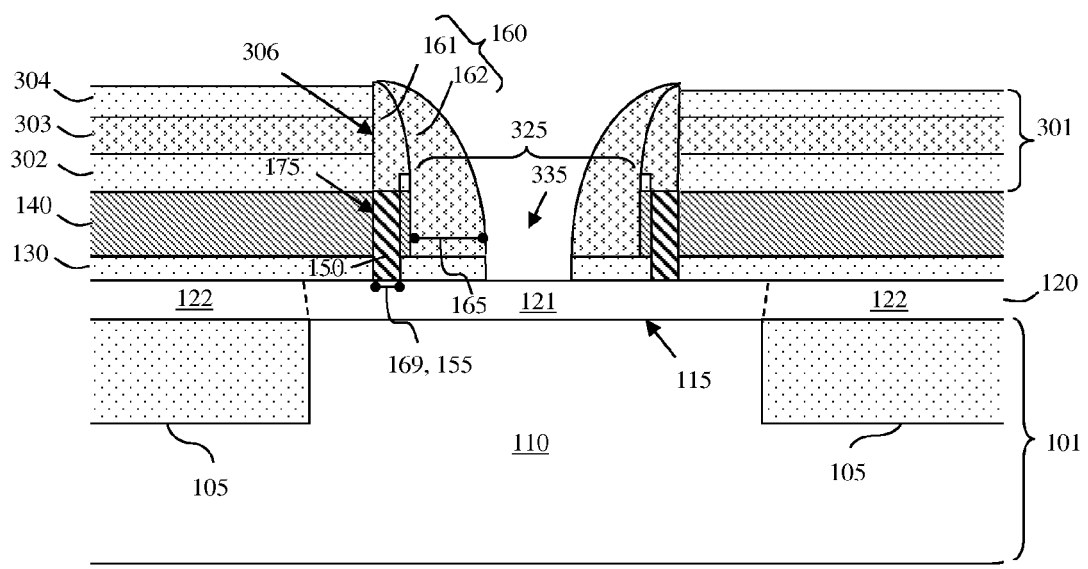
FIG. 18 is a cross-section view of a partially completed bipolar transistor structure formed according to the method of FIG. 2.

After the dielectric spacer 160 is formed at process 228, a third opening 335 (i.e., an emitter layer opening) can be formed by selectively removing any exposed first dielectric layer 130 not protected by the second portion 161 of the dielectric spacer 160 (232, see FIG. 18). This can be accomplished by performing a selective anisotropic etch process (e.g., a selective reactive ion etch (RIE) process), stopping on the intrinsic base layer 120.

Figure 19:
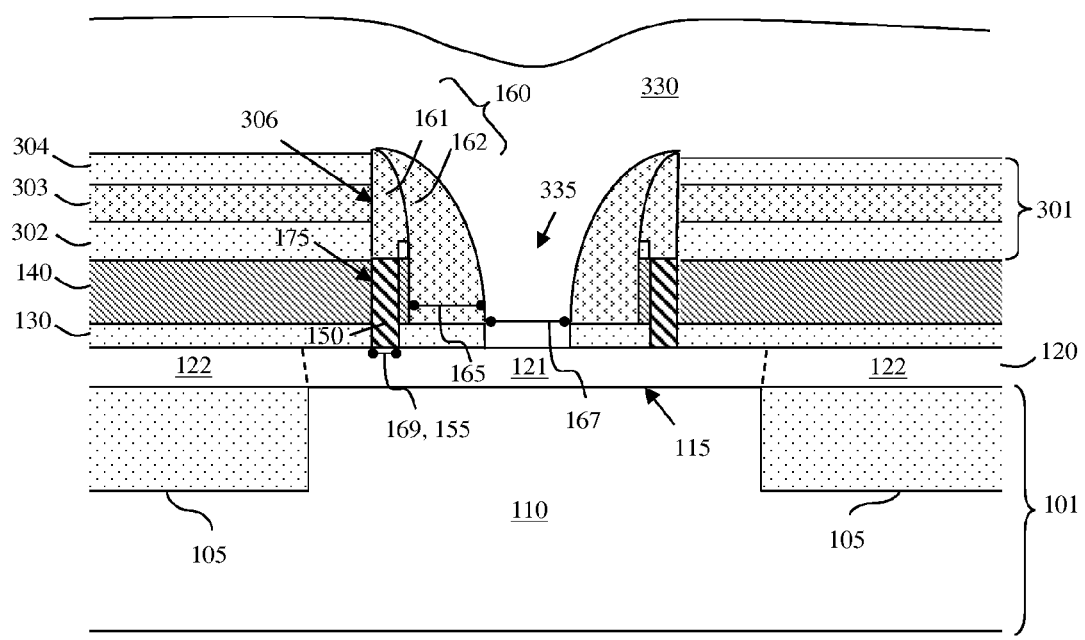
FIG. 19 is a cross-section view of a partially completed bipolar transistor structure formed according to the method of FIG. 2.

Next, an emitter layer 180, having a same conductivity type as the collector region (e.g. N-type conductivity), can be formed on the exposed intrinsic base layer 120 within the emitter layer opening 335 and, particularly, on the exposed first section 121 of the intrinsic base layer 120 such that it is positioned laterally adjacent to the $1^{st}$ dielectric layer 130 and the dielectric spacer 160. Thus, the $1^{st}$ dielectric layer 130 and dielectric spacer 160 electrically isolate the emitter layer 180 from the extrinsic base layer 140 and the conductive strap 150 (236, see FIG. 19). This can be accomplished by depositing a semiconductor layer 312 so as to fill the emitter layer opening 335 and the remaining space within the first and second openings 315, 325, as defined by the dielectric spacer 160. In the case of either a BT structure or a HBT structure, the semiconductor layer 312 can comprise a polysilicon layer. However, alternatively, in the case of a HBT structure the semiconductor layer 312 can comprise a polycrystalline silicon germanium layer.

It should be noted that the geometry of the emitter layer 180 is essentially defined by the dielectric spacer 160 because at process 235 the second portion 161 of the dielectric spacer 160 functions as a mask for defining the emitter layer opening 335 and, thereby defines the width (i.e., diameter) of the relatively narrow lower portion 181 of the emitter layer 180 in contact with the intrinsic base layer 120. The lower portion 181 can have a predetermined width 167 (e.g., a width of 0.05-0.125 μm, a width of approxiamtely 0.1 μm, etc.) in order to achieve a given area ratio between the emitter layer 180 and the intrinsic base layer 120.

Figure 20:
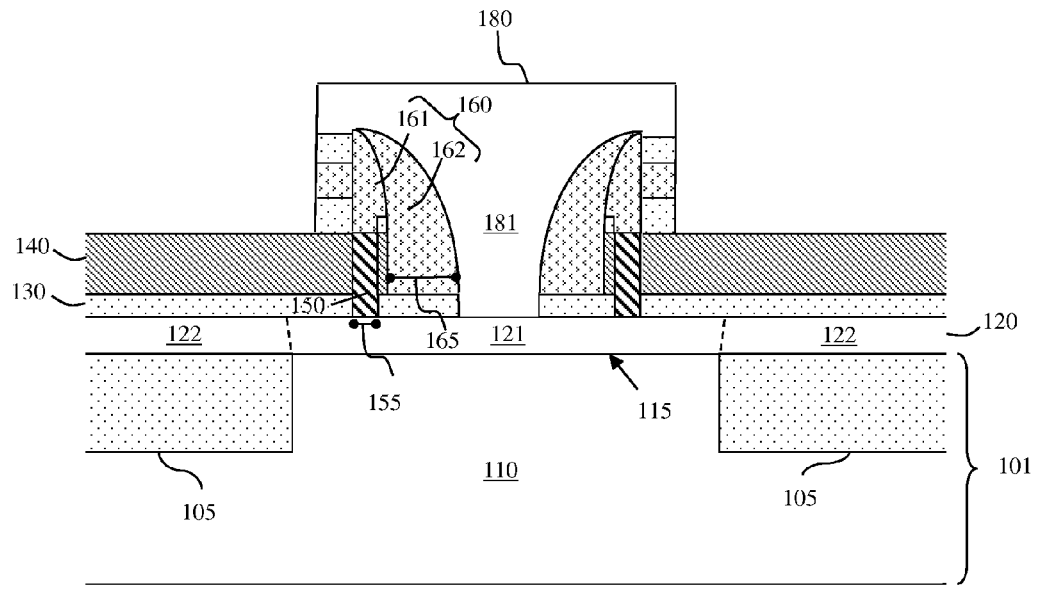
FIG. 20 is a cross-section view of a partially completed bipolar transistor structure formed according to the method of FIG. 2.
Figure 21:
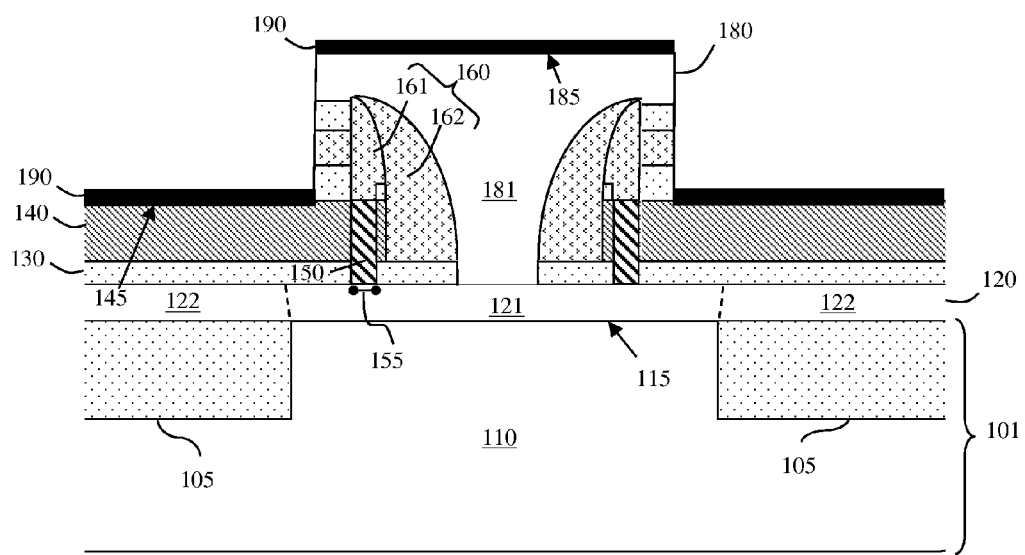
FIG. 21 is a cross-section view of a partially completed bipolar transistor structure formed according to the method of FIG. 2.

After the emitter layer 180 is performed at process 236, additional processing can be performed to complete the transistor structure 100, as shown in FIG. 1 (236). This additional processing can also include, but is not limited to, silicide layer 190 formation, interlayer dielectric 195 formation, contact formation (not shown), etc. For example, to form the silicide layers 190, a mask can be formed over the top surface 185 of the emitter layer 180 and the stack 301 of one or more dielectric layers can be etched back to expose the top surface 145 of the raised extrinsic base layer 140 (see FIG. 20). Then, the mask can be removed and a cobalt, platinum, nickel or other suitable conducting metal silicide layer can be formed, using conventional metal silicide processing techniques, on the exposed surfaces of the extrinsic base layer 140 and emitter layer 180 (see FIG. 21).

Referring again to FIG. 1, it should be noted that in above described method embodiments, the desired geometries (and, particularly, the desired widths) of the conductive strap 150, first and second portions 161-162 of the dielectric spacer 160 and the lower portion 181 of the emitter layer 180 should be predetermined so that the geometry of the first opening 315 formed at process 218 (and, particularly, the width 366 of the first opening 315, as shown in FIG. 8) can also be predetermined.

The geometries of these different features can be selectively adjusted in order to selectively adjust base resistance $R_b$, the base-emitter $C_{be}$ capacitance, and any other parameter that might impact transistor performance. For example, the conductive strap 150 can have a width 155 (e.g., a width of 0.04-0.09 μm, a width of approximately 0.05 μm, etc.) predetermined (i.e., selected) to achieve a given base resistance $R_b$. The first portion 161 of the dielectric spacer 160 can have a width 169 at least equal to the width 155 of the conductive strap 150 (e.g., a width of 0.045-0.095 μm, a width of approximately 0.055 μm, etc.) so as to entirely cover the top surface of the conductive strap 150 and ensure isolation from the emitter layer 180. The second portion 162 of the dielectric spacer 160 can have a width 165 (e.g., a width of 0.05-0.125 μm, a width of approximately 0.1 μm, etc.) predetermined (i.e., selected) to achieve both a given base-emitter $C_{be}$ capacitance and, in conjunction with the width 155 of the conductive strap 150, the given base resistance $R_b$. The lower portion 181 of the emitter layer 180 can have a width 167 (e.g., a width of 0.05-0.125 µm, a width of approxiamtely 0.1 µm, etc.) predetermined (i.e., selected) to achieve a given area ratio between the emitter layer 180 and the intrinsic base layer 120.

The first opening 315 should be formed at process 218 with a width 366 that is equal to the sum of the predetermined width 167 of the lower portion 181 of the emitter layer 180, the predetermined width 169 of the first portion 161 of the dielectric spacer 160 times two and the predetermined width 165 of the second portion 162 of the dielectric spacer 160 also times. Thus, with the exemplary geometries provides above (e.g., if the predetermined widths for the conductive strap 150, first portion 161 of the dielectric spacer 160, the second portion 162 of the dielectric spacer and the lower portion 181 of the emitter layer 180 are 0.05 µm, 0.055 µm, 0.1 µm and 0.1 µm, respectively, then the predetermined width 366 for the first opening 305 at process step 218 should be at least 0.51 µm.

It should also be understood that in the method embodiments, described in detail above, any component formed with an N-type conductivity will be doped (e.g., either in-situ doped, subsequently implanted, etc.) with an N-type conductivity dopant and any component formed with a P-type conductivity will be doped (e.g., either in-situ doped, subsequently implanted, etc.) with a P-type conductivity dopant. Such N-type conductivity dopants can comprise, for example, Group V dopants, such as arsenic (As), phosphorous (P) or antimony (Sb) and such P-type conductivity dopants can comprise, for example, Group III dopants, such as boron (B) or indium (In)).

It should further be understood that the terminology used herein is for the purpose of describing particular embodiments only and is not intended to be limiting of the invention. For example, for illustration purposes, the novel transistor structure of the present invention (e.g., see structure 100a of FIG. 1A or structure 100b of FIG. 1B) was described in detail above with respect to an NPN transistor (i.e., a transistor in which the collector has an N-type conductivity, the base has a P-type conductivity and the emitter has an N-type conductivity). Similarly, the novel method of the present invention was described in detail above with respect to forming an NPN transistor. However, it should be understood that this description is not intended to be limiting and that the novel structure and method could also apply to a PNP transistor (i.e., a transistor in which the collector has a P-type conductivity, the base has an N-type conductivity and the emitter has a P-type conductivity).

Disclosed herein are additional steps that can be incorporated into processes 222 and 224 of the method embodiments, which are described above and illustrated in FIG. 2, in order to improve yield of the resulting transistor 100, as described above and illustrated in FIG. 1. Specifically, at process 222, the sacrificial dielectric layer 309 must be formed thick enough to withstand various etch and cleaning processes and still remain intact to function as an etch stop layer when the conductive strap 150 is formed at process 226 (e.g., when in-situ doped polysilicon is deposited so as to fill the trench and then recessed so as to form the conductive strap, as described in detail above).

Figure 22:
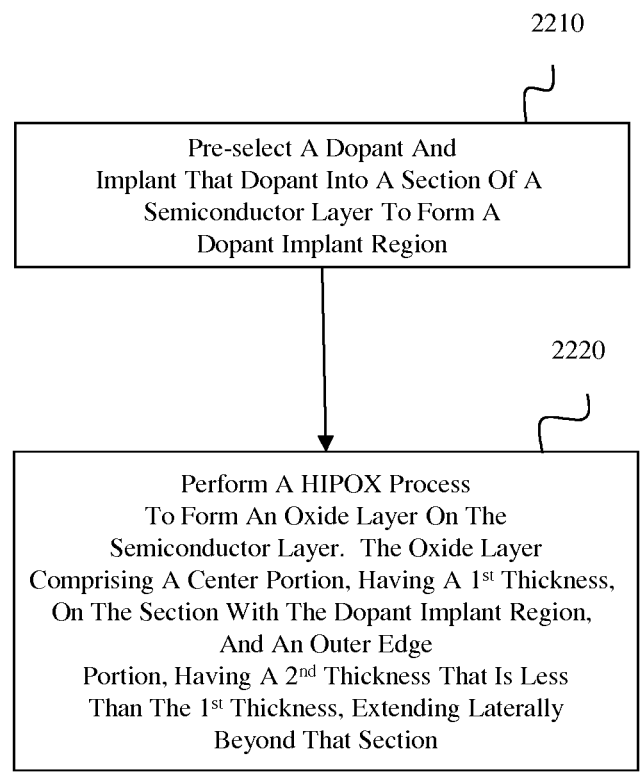
FIG. 22 is a flow diagram illustrating an exemplary method of forming a relatively thick oxide layer.

Referring to FIG. 22, one technique for forming a relatively thick dielectric layer and, particularly, a relatively thick oxide layer can comprise introducing (e.g., by implanting or other suitable technique) a dopant into a section of a semiconductor layer to form a doped region (e.g., a dopant implant region) (2210). Then, an oxidation process (e.g., a high pressure, low temperature oxidation (HIPOX) process) can be performed in order to form an oxide layer on the top surface the semiconductor layer (2220). The dopant is preselected so that it will enhance the oxidation process (i.e., so that it will increase the oxidation rate). Thus, the resulting oxide layer comprises a center portion, having a first thickness, adjacent to the section of the semiconductor layer with the doped region and an outer edge portion, having a second thickness that is less than said first thickness, extending laterally beyond that section.

Figure 23:
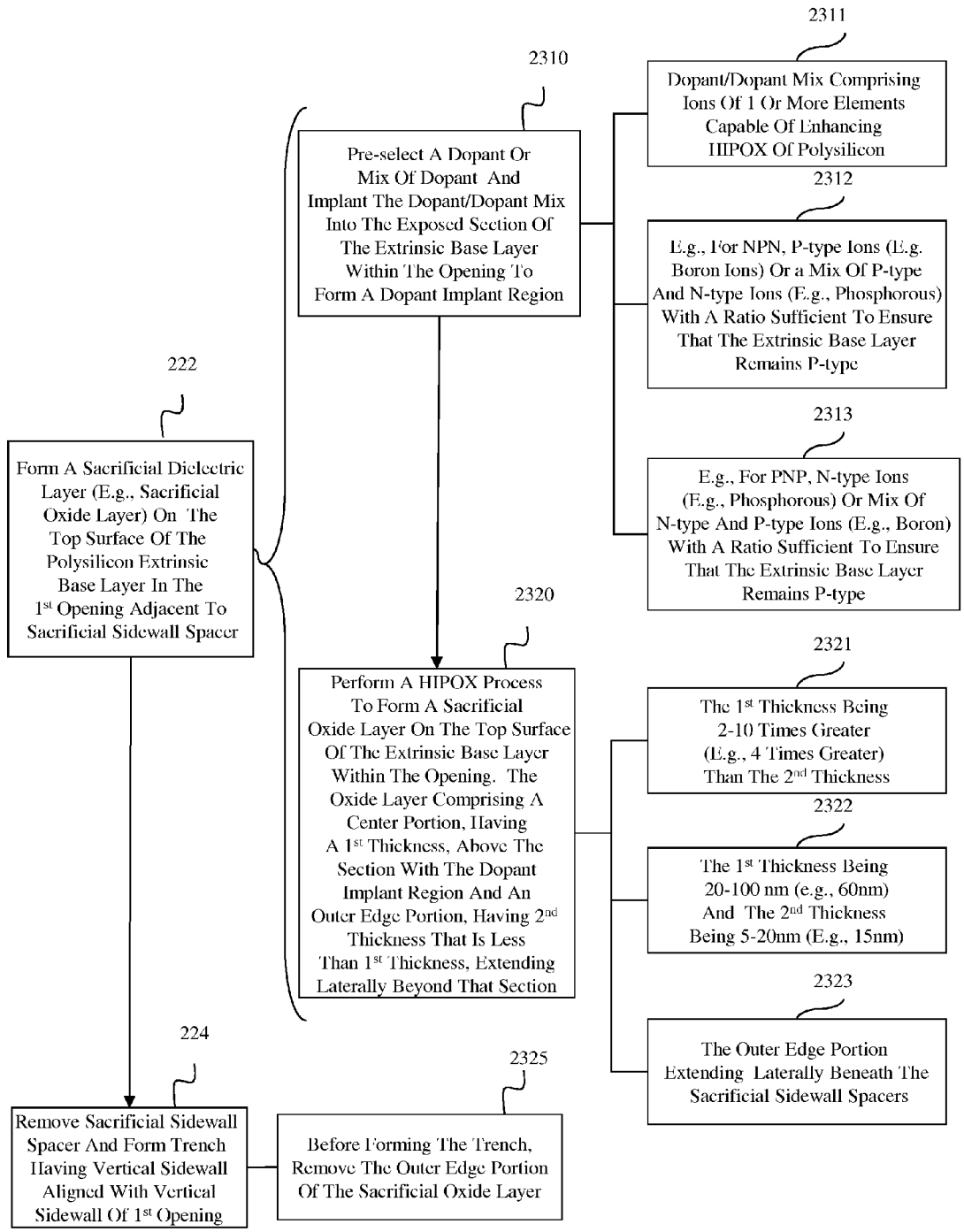
FIG. 23 is a flow diagram illustrating incorporation of the method of FIG. 22 into processes 222 and 224 of FIG. 2.
Figure 24:
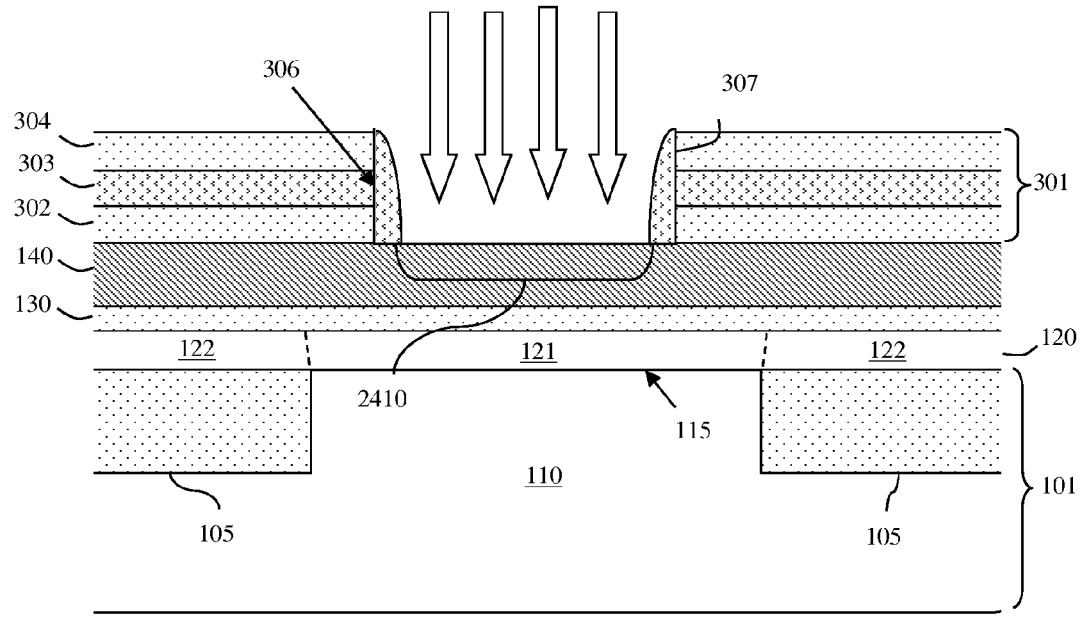
FIG. 24 is a cross-section view of a partially completed bipolar transistor structure formed according to steps shown in FIG. 23.

This same technique can be used to ensure that the sacrificial dielectric layer 309 formed at process 222 is sufficiently thick. That is, referring to FIG. 23, after the sacrificial sidewall spacer 307 (e.g., the sacrificial nitride spacer) is formed on the first vertical sidewall 306 of the opening 315 is formed at process 220, as shown in FIG. 9, a dopant or mix of dopants can be introduced into a section of the polysilicon extrinsic base layer 140 that remains exposed in the opening 315 to form a doped region 2410 (2310, see FIG. 24). This process 2310 can be accomplished using a conventional dopant ion implantation process, thereby forming a dopant implant region 2410 at the top surface of the extrinsic base layer 140 within the opening 315 between the sidewall spacers 307. Those skilled in the art will recognize that as a result of such a dopant implantation process lateral diffusion of dopant ions may occur such that the dopant implant region 2410 extends partially beneath the sidewall spacer 307. Alternatively, any other suitable technique for introducing a dopant into this section to form a doped region could be used at process 2310.

The dopant or mix of dopants used during this process 2310 can be pre-selected such that it comprises ions capable of chemically enhancing oxidation, such as high-pressure low temperature oxidation (HIPOX), of polysilicon (2311). That is, the dopant or mix of dopants used can be pre-selected so as to comprise ions that, when introduced into a substrate, will increase the rate of oxidation of that substrate. Both P-type dopants and N-type dopants can have such an effect on a silicon-based substrate (i.e., polycrystalline silicon or single crystalline silicon). Those skilled in the art will recognize that, in the case of a silicon-based substrate, a P-type dopant can comprise, for example, a Group III dopant, such as boron (B) or indium (In), whereas an N-type dopant can comprise, for example, a Group V dopant, such as arsenic (As), phosphorous (P) or antimony (Sb).

It should be noted that the rate of oxidation of the substrate will vary depending upon the specific dopant or mix of dopants used. For example, depending upon the dose and implantation energy used, boron (B) can chemically enhance HIPOX of polysilicon at a rate of almost twice the rate of pure polysilicon. At the same dose and implant energy, phosphorous (P) can chemically enhance HIPOX of polysilicon at an even greater rate than boron (B).

Thus, in the case of an N-P-N transistor having a P-type extrinsic base layer, a P-type dopant alone (e.g., boron (B)) can be used (2312). Alternatively, a mix of both P-type and N-type dopants (e.g., boron (B) and phosphorous (P), respectively) can be used as long as the ratio of P-type dopant to N-type dopant (e.g., boron (B) ions to phosphorous (P) ions) is such that the conductivity type of the extrinsic base layer remains P-type.

Contrarily, in the case of a P-N-P transistor having an N-type extrinsic base layer, an N-type dopant alone (e.g., phosphorous (P)) can be used (2313). Alternatively, a mix of both N-type and P-type dopants (e.g., phosphorous (P) and boron (B), respectively) can be used as long as the ratio of N-type dopant to P-type dopant (e.g., phosphorous (P) ions to boron (B) ions) is such that the conductivity type of the extrinsic base layer remains N-type.

Figure 25:
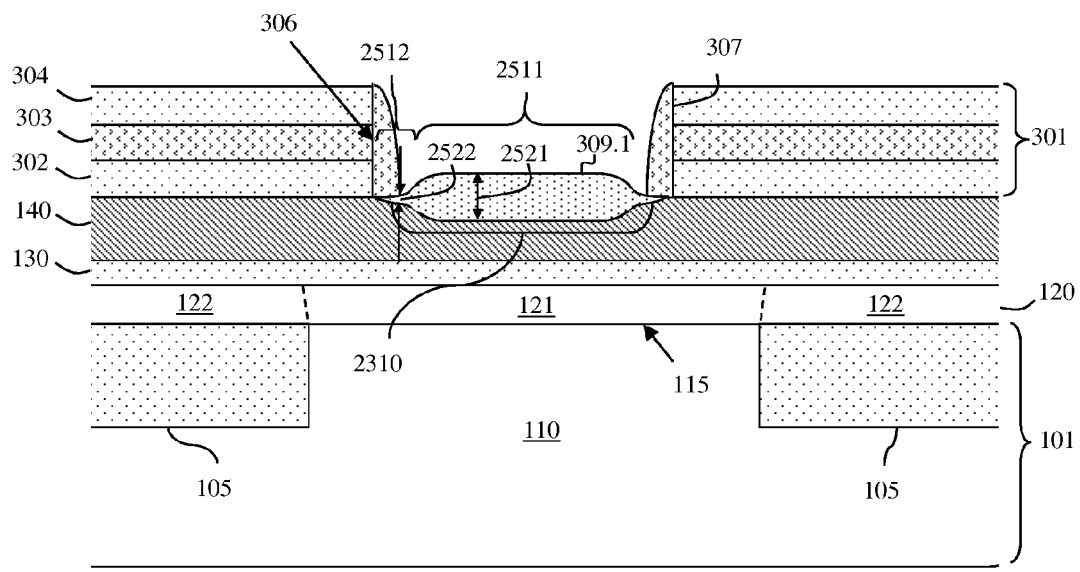
FIG. 25 is a cross-section view of a partially completed bipolar transistor structure formed according to the steps shown in FIG. 23.

After process 2310 is performed, a sacrificial dielectric layer and, particularly, a sacrificial oxide layer 309.1 can be formed on the top surface of the extrinsic base layer 140 by performing an oxidation process (2320, see FIG. 25). For example, a high pressure, low temperature, oxidation (HIPOX) process can be conducted in a high-pressure atmosphere consisting of about 5 atmospheres to about 30 atmospheres of oxygen with a trace amount of water vapor, and at about 500° C. to about 800° C.

In this case, the dopant or mix of dopants (e.g., boron (B), phosphorous (P) or a boron (B)-phosphorous (P) mix, as appropriate) in the doped region 2410 chemically enhances the (HIPOX) process such that the resulting sacrificial oxide layer 309.1 comprises a relatively thick center portion 2511. However, as the sacrificial oxide layer 309.1 is being formed by this HIPOX process, its outer edge 2512 will extend laterally beneath the sidewall spacer 307 and beyond the boundary of the doped region 2410 (i.e., beyond the section of the extrinsic base layer that remained exposed within the opening following sidewall spacer 307 formation at process 220 of FIG. 2). Since the outer edge portion 2512 extends laterally beyond the boundary of the doped region 2410, the HIPOX process that forms this edge portion 2512 is either not chemically enhanced at all or only minimally chemically enhanced. Thus, the outer edge portion 2512 will be relatively thin as compared to the center portion 2511 (e.g., resulting in a "beak" shape). That is, the center portion 2511 of the sacrificial oxide layer 309.1, which is adjacent to the section of the extrinsic base layer 140 with the doped region 2410, will have a first thickness 2521 and the outer edge portion 2512, which extends laterally beyond that section, will have a second thickness 2522 that is less than the first thickness 2521 such that the shape of the sacrificial oxide layer 309.1 tapers sharply as it extends laterally beneath the sidewall spacer 307.

Depending upon the dopant and, if applicable, the implant dose and the energy used during a dopant implant process 2310, the first thickness 2521 of the center portion 2511 can be two to ten times (e.g., four times) greater than the second thickness 2522 of the outer edge portion 2512, as measured from the exposed vertical surface of the sidewall spacer 307. For example, at process 2310, boron (B) ions can be implanted at a dose of approximately $3 \times 10^{15}$ ions/cm$^2$ with an implant energy of several keV (e.g., 5-10 keV, such as 8 keV) to achieve a sacrificial oxide layer 309.1 at process 2320 with a center portion 2511, having a first thickness 2521 ranging from 20 nm to 100 nm (e.g., approximately 60 nm), and with an outer edge portion 2512, having a second thickness 2522 ranging from 5 nm to 20 nm (e.g., approximately 15 nm), as measured from the exposed vertical surface of the sidewall spacer 307.

Figure 26:
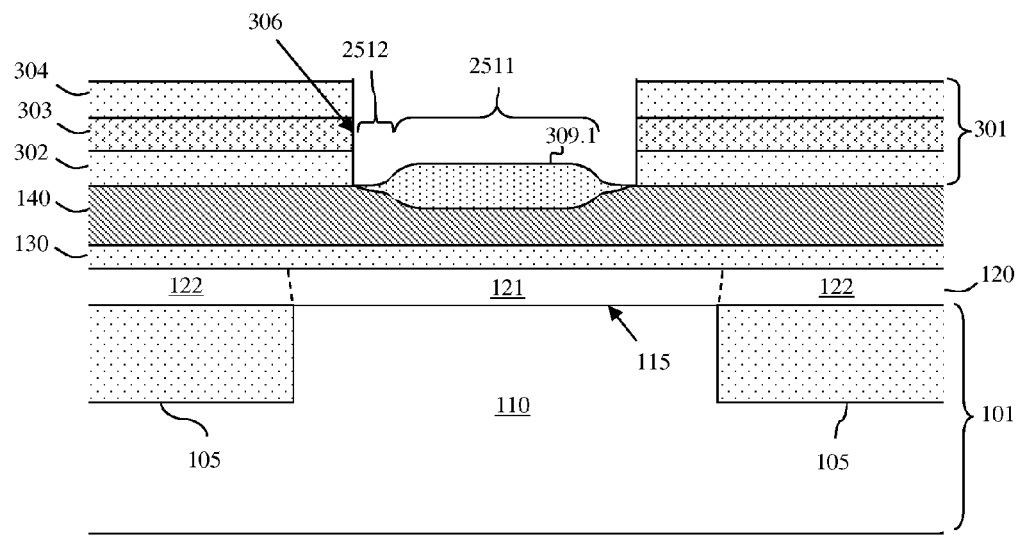
FIG. 26 is a cross-section view of a partially completed bipolar transistor structure formed according to the steps shown in FIG. 23.
Figure 27:
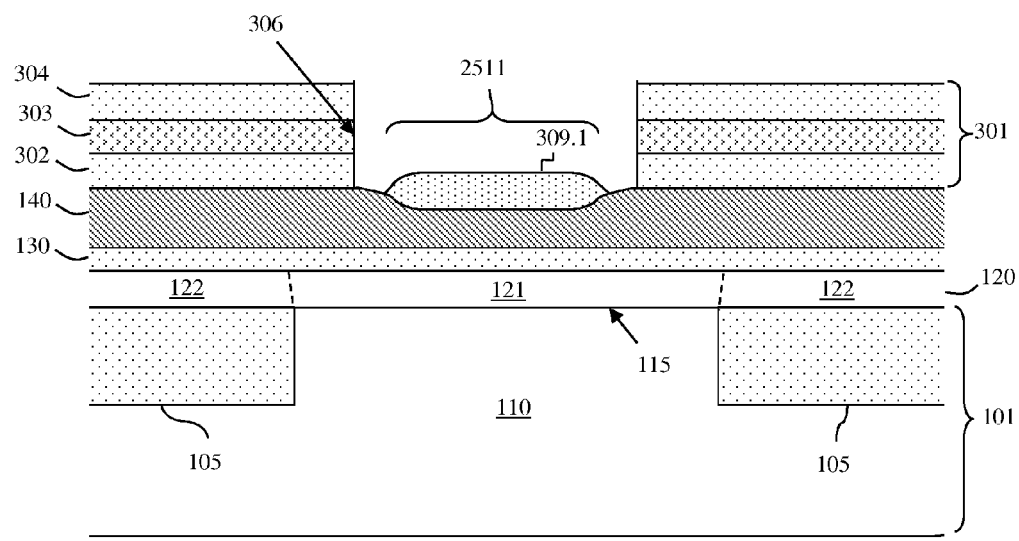
FIG. 27 is a cross-section view of a partially completed bipolar transistor structure formed according to the steps shown in FIG. 23.

As discussed above, following the formation of the sacrificial oxide layer 309.1, the sidewall spacer 307 can be selectively removed and a trench 170 can be formed in essentially the same manner as described above with respect to process 224 of FIG. 2. However, referring again to FIG. 23, between these processes the outer edge portion 2512 of the sacrificial oxide layer 309.1 can be removed to allow the trench 170 to be formed (2325). Specifically, the sacrificial nitride sidewall spacer 307 can be selectively removed, for example, by a reactive ion etch (RIE) process or a wet etch process (e.g., a hot phosphorous wet etch process) (see FIG. 26). Then, the outer edge portion 2512 of the sacrificial oxide layer 309.1 can be removed, for example, by a reactive ion etch (RIE) process or a wet etch process (e.g., a hydrogen fluoride (HF) wet etch) (2325, see FIG. 27). During this etch process 2325, the center portion 2511 of the sacrificial oxide layer 309.1 can be masked so that it remains fully intact. Alternatively, this etch process 2325 can be timed to stop upon removal of the thin outer edge portion 2512. Thus, the center portion 2511 will be thinned slightly (e.g., by an amount approximately equal to the second thickness 2522 of the outer edge portion 2512).

Once the outer edge portion 2512 of the sacrificial oxide layer 309.1 is removed at process 2325, the trench 170 can be formed and the additional process steps 226-238 can be performed in the same manner as described in detail above and illustrated in FIG. 2. As mentioned above, the use of chemically enhanced oxidation at process 222 ensures that the resulting sacrificial oxide layer has a center portion 2511 that is sufficiently thick to withstand various etch and cleaning processes and still remain intact to function as an etch stop layer when the conductive strap 150 is formed at process 226 (e.g., when in-situ doped polysilicon is deposited so as to fill the trench and then recessed so as to form the conductive strap).

It should be understood that the terminology used herein is for the purpose of describing particular embodiments only and is not intended to be limiting of the invention. As used herein, the singular forms "a", "an" and "the" are intended to include the plural forms as well, unless the context clearly indicates otherwise. It should further be understood that the terms "comprises" "comprising", "includes" and/or "including", when used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. Finally, it should be understood that the description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Therefore, disclosed above are embodiments of an improved transistor structure (e.g., a bipolar transistor (BT) structure or heterojunction bipolar transistor (HBT) structure) and a method of forming the transistor structure. The structure embodiments can incorporate a dielectric layer sandwiched between an intrinsic base layer and a raised extrinsic base layer to reduce collector-base capacitance $C_{cb}$, a sidewall-defined conductive strap for an intrinsic base layer to extrinsic base layer link-up region to reduce base resistance $R_b$ and a dielectric spacer between the extrinsic base layer and an emitter layer to reduce base-emitter $C_{be}$ capacitance. The method embodiments allow for self-aligning of the emitter to base regions and do so without the use of the critical alignment, chemical mechanical polishing or selective epitaxy. The method embodiments further allow the geometries of different features (e.g., the thickness of the dielectric layer, the width of the conductive strap, the width of the dielectric spacer and the width of the emitter layer) to be selectively adjusted in order to selectively adjust the collector-base capacitance $C_{cb}$, the base resistance $R_b$ and the base-emitter $C_{be}$ capacitance, and thereby to optimize transistor performance. Specifically, the method embodiments provide a degree of freedom to independently change the collector-base capacitance $C_{cb}$, the base resistance $R_b$ and the base-emitter $C_{be}$ capacitance and, therefore, $F_{max}$, without comprising (i.e., with no or only minimal changes to) other device performance figures of merit (e.g., peak $f_T$, current peak $f_T$).

Newly disclosed herein are additional steps that can be incorporated into the method embodiments in order to improve the yield of the resulting transistor structure. Specifically, during processing, a sacrificial dielectric layer must be formed thick enough to withstand various etch and cleaning processes and still remain intact to function as an etch stop layer when the conductive strap is subsequently formed. One technique that can be used to ensure that the sacrificial dielectric layer is sufficiently thick is to form the sacrificial dielectric layer using a chemically enhanced oxidation process (e.g., a high pressure, low temperature, oxidation (HIPOX) process).

What is claimed is:

1. A method of forming a transistor, said method comprising:
   forming trench isolation regions at a top surface of a semiconductor substrate;
   forming an intrinsic base layer on said top surface and extending laterally over said trench isolation regions;
   forming a first dielectric layer on said intrinsic base layer;
   forming an extrinsic base layer on said first dielectric layer;
   forming at least one second dielectric layer on said extrinsic base layer;
   forming an opening extending through said at least one second dielectric layer to said extrinsic base layer, said opening having a first vertical sidewall;
   forming a sacrificial sidewall spacer on said first vertical sidewall such that a section of said extrinsic base layer within said opening remains exposed;
   introducing a dopant into said section;
   performing an oxidation process to form a sacrificial oxide layer on a top surface of said extrinsic base layer within said opening, said dopant enhancing said oxidation process such that said sacrificial oxide layer comprises:
      a center portion above said section and having a first thickness; and
      an outer edge portion extending laterally beyond said section and having a second thickness that is less than said first thickness;
   selectively removing said sacrificial sidewall spacer;
   forming, between said first vertical sidewall and said sacrificial oxide layer, a trench extending through said extrinsic base layer and said first dielectric layer to said intrinsic base layer such that said trench conforms to a perimeter of said opening and has second vertical sidewall aligned directly below said first vertical sidewall; and
   forming a conductive strap within said trench adjacent to said second vertical sidewall such that said conductive strap is essentially rectangular shape and electrically connects said intrinsic base layer to said extrinsic base layer.

2. The method of claim 1, said first thickness being two to ten times said second thickness.

3. The method of claim 1, said introducing of said dopant comprising implanting said dopant.

4. The method of claim 2, said first thickness ranging between 20 nm and 100 nm and said second thickness ranging between 5 and 20 nm.

5. The method of claim 1, said outer edge portion extending laterally beneath said sacrificial sidewall spacer.

6. The method of claim 5, after said removing of said sacrificial sidewall spacer and before said forming of said trench, removing said outer edge portion of said sacrificial oxide layer.

7. The method of claim 1, said forming of said extrinsic base layer comprising forming a polysilicon layer and said method further comprising preselecting said dopant such that said dopant comprises ions of at least one element capable of increasing a rate of chemical oxidation of polysilicon.

8. The method of claim 1, said extrinsic base layer comprising a P-type polysilicon layer and said dopant comprising any one of the following:
   a P-type dopant; and
   a mix of P-type and N-type dopants and a ratio of P-type dopant to N-type dopant in said mix being such that a conductivity type of said extrinsic base layer remains P-type.

9. The method of claim 8, said P-type dopant comprising boron and said mix comprising a mix of boron and phosphorous.

10. The method of claim 1, said extrinsic base layer comprising an N-type polysilicon layer and said dopant comprising any one of the following:
    an N-type dopant; and
    a mix of N-type and P-type dopants and a ratio of N-type dopant to P-type dopant in said mix being such that a conductivity type of said extrinsic base layer remains N-type.

11. A method of forming a transistor, said method comprising:
    forming trench isolation regions at a top surface of a semiconductor substrate;
    forming an intrinsic base layer on said top surface and extending laterally over said trench isolation regions;
    forming a first oxide layer on said intrinsic base layer;
    forming an extrinsic base layer on said first oxide layer;
    forming a stack of dielectric layers on said extrinsic base layer, said stack comprising: a second oxide layer on said extrinsic base layer; a nitride layer on said second oxide layer; and a third oxide layer on said nitride layer;
    performing an anisotropic etch process to form an opening extending through said stack to said extrinsic base layer, said opening having a first vertical sidewall;
    forming a sacrificial nitride sidewall spacer on said first vertical sidewall such that a section of said extrinsic base layer within said opening remains exposed;
    introducing a dopant into said section;
    performing an oxidation process to form a sacrificial oxide layer on a top surface of said extrinsic base layer within said opening, said dopant chemically enhancing said oxidation process such that said sacrificial oxide layer comprises:
       a center portion above said section and having a first thickness; and
       an outer edge portion extending laterally beyond said section and having a second thickness that is less than said first thickness;
    selectively removing said sacrificial nitride sidewall spacer;
    performing an additional anisotropic etch process to form, between said first vertical sidewall and said sacrificial oxide layer, a trench extending through said extrinsic base layer and said first oxide layer to said intrinsic base layer such that said trench conforms to a perimeter of said opening and has a second vertical sidewall aligned directly below said first vertical sidewall;

depositing in-situ doped polysilicon so as to fill said trench; and recessing said in-situ doped polysilicon so as to form a conductive strap positioned laterally immediately adjacent to said second vertical sidewall such that said conductive strap is essentially rectangular in shape and electrically connects said intrinsic base layer to said extrinsic base layer.

12. The method of claim 11, said first thickness being two to ten times said second thickness.

13. The method of claim 11, said introducing of said dopant comprising implanting said dopant.

14. The method of claim 11, said outer edge portion extending laterally beneath said sacrificial sidewall spacer.

15. The method of claim 11, after said removing of said sacrificial sidewall spacer and before said performing of said additional anisotropic etch process, removing said outer edge portion of said sacrificial oxide layer.

16. The method of claim 11, said forming of said extrinsic base layer comprising forming a polysilicon layer and said method further comprising preselecting said dopant such that said dopant comprises ions of at least one element capable of increasing a rate of oxidation of polysilicon.

17. The method of claim 11, said extrinsic base layer comprising a P-type polysilicon layer and said dopant comprising any one of the following:
 a P-type dopant; and
 a mix of P-type and N-type dopants and a ratio of P-type dopant to N-type dopant in said mix being such that a conductivity type of said extrinsic base layer remains P-type.

18. The method of claim 17, said P-type dopant comprising boron and said mix comprising a mix of boron and phosphorous.

19. The method of claim 11, said extrinsic base layer comprising an N-type polysilicon layer and said dopant comprising any one of the following:
 an N-type dopant; and
 a mix of N-type and P-type dopants and a ratio of N-type dopant to P-type dopant in said mix being such that a conductivity type of said extrinsic base layer remains N-type.

20. A method of forming a transistor, said method comprising:

forming trench isolation regions at a top surface of a semiconductor substrate;

forming an intrinsic base layer on said top surface and extending laterally over said trench isolation regions;

forming a first dielectric layer on said intrinsic base layer;

forming an extrinsic base layer on said first dielectric layer, said extrinsic base layer having a first conductivity type;

forming at least one second dielectric layer on said extrinsic base layer;

forming an opening extending through said at least one second dielectric layer to said extrinsic base layer, said opening having a first vertical sidewall;

forming a sacrificial sidewall spacer on said first vertical sidewall such that a section of said extrinsic base layer within said opening remains exposed;

introducing a mix of first conductivity type dopants and second conductivity type dopants into said section, wherein a ratio of said first conductivity type dopants to said second conductivity type dopants in said mix being such that said section retains said first conductivity type after said introducing;

performing an oxidation process to form a sacrificial oxide layer on a top surface of said extrinsic base layer within said opening, said dopants enhancing said oxidation process such that said sacrificial oxide layer comprises:
 a center portion above said section and having a first thickness; and
 an outer edge portion extending laterally beyond said section and having a second thickness that is less than said first thickness;

selectively removing said sacrificial sidewall spacer;

forming, between said first vertical sidewall and said sacrificial oxide layer, a trench extending through said extrinsic base layer and said first dielectric layer to said intrinsic base layer such that said trench conforms to a perimeter of said opening and has second vertical sidewall aligned directly below said first vertical sidewall; and forming a conductive strap within said trench adjacent to said second vertical sidewall such that said conductive strap is essentially rectangular shape and electrically connects said intrinsic base layer to said extrinsic base layer.

* * * * *